(12) United States Patent
Choe

(10) Patent No.: US 9,306,191 B2
(45) Date of Patent: Apr. 5, 2016

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventor: Won-Kyu Choe, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 143 days.

(21) Appl. No.: 13/841,125

(22) Filed: Mar. 15, 2013

(65) Prior Publication Data

US 2014/0110680 A1   Apr. 24, 2014

(30) Foreign Application Priority Data

Oct. 22, 2012   (KR) .................. 10-2012-0117504

(51) Int. Cl.
| | |
|---|---|
| *H01L 29/18* | (2006.01) |
| *H01L 27/15* | (2006.01) |
| *H01L 51/56* | (2006.01) |
| *H01L 27/32* | (2006.01) |

(52) U.S. Cl.
CPC ............ *H01L 51/56* (2013.01); *H01L 27/3206* (2013.01); *H01L 27/3244* (2013.01); *H01L 27/3279* (2013.01)

(58) Field of Classification Search
CPC ..................... H01L 27/3206; H01L 27/3244
USPC ..................... 257/40, 88; 313/504
See application file for complete search history.

(56) References Cited

U.S. PATENT DOCUMENTS

| | | | |
|---|---|---|---|
| 6,274,198 | B1 | 8/2001 | Dautartas |
| 6,371,451 | B1 | 4/2002 | Choi |
| 6,749,906 | B2 | 6/2004 | Van Slyke |
| 6,781,162 | B2 * | 8/2004 | Yamazaki et al. ............ 257/184 |
| 6,995,035 | B2 | 2/2006 | Cok et al. |

(Continued)

FOREIGN PATENT DOCUMENTS

| | | |
|---|---|---|
| EP | 1 413 644 A2 | 4/2004 |
| EP | 1 518 940 A1 | 3/2005 |

(Continued)

OTHER PUBLICATIONS

Patent Abstracts of Japan and English Machine Translation of JP 11-144865, 32 pages.

(Continued)

*Primary Examiner* — David Vu
*Assistant Examiner* — Brandon Fox
(74) *Attorney, Agent, or Firm* — Lewis Roca Rothgerber Christie LLP

(57) ABSTRACT

An organic light-emitting display apparatus includes: a substrate; a plurality of thin film transistors on the substrate, each of the thin film transistors including an active layer, a gate electrode, and source and drain electrodes; first electrodes electrically connected to the plurality of thin film transistors, respectively, and being on respective pixels corresponding to the plurality of thin film transistors; organic layers on the first electrodes, respectively, and including light-emitting layers; auxiliary electrodes each of which is on at least a portion between adjacent organic layers of the organic layers; and a second electrode facing the first electrodes and covering the organic layers and the auxiliary electrodes.

48 Claims, 15 Drawing Sheets

(56) References Cited

U.S. PATENT DOCUMENTS

| | | |
|---|---|---|
| 7,495,389 B2 | 2/2009 | Noguchi et al. |
| 7,601,439 B2 | 10/2009 | Chun et al. |
| 7,776,457 B2 | 8/2010 | Lee et al. |
| 2001/0006827 A1 | 7/2001 | Yamazaki et al. |
| 2002/0017245 A1 | 2/2002 | Tsubaki et al. |
| 2002/0076847 A1 | 6/2002 | Yamada et al. |
| 2002/0168577 A1 | 11/2002 | Yoon |
| 2003/0101937 A1 | 6/2003 | Van Slyke et al. |
| 2003/0168013 A1 | 9/2003 | Freeman et al. |
| 2003/0221614 A1 | 12/2003 | Kang et al. |
| 2003/0232563 A1 | 12/2003 | Kamiyama et al. |
| 2004/0115338 A1 | 6/2004 | Yoneda |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0194702 A1 | 10/2004 | Sasaki et al. |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0166842 A1 | 8/2005 | Sakamoto |
| 2006/0066231 A1 | 3/2006 | Nishikawa et al. |
| 2006/0144325 A1 | 7/2006 | Jung et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2007/0075955 A1 | 4/2007 | Jung et al. |
| 2007/0077358 A1 | 4/2007 | Jeong et al. |
| 2007/0178708 A1 | 8/2007 | Ukigaya |
| 2008/0018236 A1 | 1/2008 | Arai et al. |
| 2008/0115729 A1 | 5/2008 | Oda et al. |
| 2008/0131587 A1 | 6/2008 | Boroson et al. |
| 2008/0216741 A1 | 9/2008 | Ling et al. |
| 2009/0017192 A1 | 1/2009 | Matsuura |
| 2009/0232976 A1 | 9/2009 | Yoon et al. |
| 2010/0328197 A1* | 12/2010 | Lee et al. .................... 345/82 |
| 2011/0052791 A1 | 3/2011 | Jo et al. |
| 2011/0068331 A1 | 3/2011 | Koh et al. |
| 2012/0097992 A1 | 4/2012 | Jeong |
| 2012/0154722 A1* | 6/2012 | Kang .................... G02B 5/003 |
| | | 349/106 |
| 2012/0217516 A1* | 8/2012 | Hatano ................. H01L 51/525 |
| | | 257/88 |
| 2012/0299023 A1 | 11/2012 | Lee et al. |
| 2013/0009177 A1* | 1/2013 | Chang et al. ................ 257/88 |

FOREIGN PATENT DOCUMENTS

| | | |
|---|---|---|
| JP | 04-272170 A | 9/1992 |
| JP | 11-144865 A | 5/1999 |
| JP | 2000-068054 | 3/2000 |
| JP | 2001-052862 A | 2/2001 |
| JP | 2001-093667 A | 4/2001 |
| JP | 2002-175878 A | 6/2002 |
| JP | 2003-3250 | 1/2003 |
| JP | 2003-077662 A | 3/2003 |
| JP | 2003-157973 A | 5/2003 |
| JP | 2003-297562 A | 10/2003 |
| JP | 2004-043898 A | 2/2004 |
| JP | 2004-103269 A | 4/2004 |
| JP | 2004-103341 A | 4/2004 |
| JP | 2004-199919 A | 7/2004 |
| JP | 2005-044592 A | 2/2005 |
| JP | 2005-235568 A | 9/2005 |
| JP | 2005-293968 A | 10/2005 |
| JP | 2005-296737 A | 10/2005 |
| JP | 2006-275433 A | 10/2006 |
| JP | 2007-047293 A | 2/2007 |
| JP | 2007-242436 A | 9/2007 |
| JP | 2008-121098 A | 5/2008 |
| JP | 2009-019243 A | 1/2009 |
| JP | 2009-87910 A | 4/2009 |
| KP | 10-2007-0037848 A | 4/2007 |
| KR | 10-0257219 B1 | 2/2000 |
| KR | 10-2000-0019254 A | 4/2000 |
| KR | 10-2000-0023929 A | 5/2000 |
| KR | 10-2001-0059939 A | 7/2001 |
| KR | 10-2002-0000201 A | 1/2002 |
| KR | 10-2002-0050922 A | 6/2002 |
| KR | 10-2002-0090934 A | 12/2002 |
| KR | 10-2002-0091457 A | 12/2002 |
| KR | 10-0405080 B1 | 11/2003 |
| KR | 10-2003-0091947 A | 12/2003 |
| KR | 10-2003-0093959 A | 12/2003 |
| KR | 10-2004-0050045 A | 6/2004 |
| KR | 10-2004-0069281 A | 8/2004 |
| KR | 10-2004-0084747 A | 10/2004 |
| KR | 10-0463212 B1 | 12/2004 |
| KR | 10-0483487 B1 | 4/2005 |
| KR | 10-0520159 B1 | 10/2005 |
| KR | 10-2006-0008602 A | 1/2006 |
| KR | 10-2006-0018745 A | 3/2006 |
| KR | 10-2006-0045225 A | 5/2006 |
| KR | 10-2006-0051746 A | 5/2006 |
| KR | 10-2006-0053926 | 5/2006 |
| KR | 10-2006-0059323 A | 6/2006 |
| KR | 10-2006-0073367 A | 6/2006 |
| KR | 10-2006-0080475 A | 7/2006 |
| KR | 10-2006-0080481 A | 7/2006 |
| KR | 10-2006-0080482 A | 7/2006 |
| KR | 10-2006-0083510 A | 7/2006 |
| KR | 10-2006-0104675 A | 10/2006 |
| KR | 10-2006-0104677 A | 10/2006 |
| KR | 10-2006-0109627 A | 10/2006 |
| KR | 10-0635903 B1 | 10/2006 |
| KR | 10-2006-0114477 A | 11/2006 |
| KR | 10-2006-0114573 A | 11/2006 |
| KR | 10-0646160 B1 | 11/2006 |
| KR | 10-0687007 B1 | 2/2007 |
| KR | 10-2007-0025164 A | 3/2007 |
| KR | 10-070466 B1 | 3/2007 |
| KR | 10-0696547 B1 | 3/2007 |
| KR | 10-0697663 B1 | 3/2007 |
| KR | 10-0698033 B1 | 3/2007 |
| KR | 10-2007-0035796 A | 4/2007 |
| KR | 10-0711885 B1 | 4/2007 |
| KR | 10-2007-0050793 A | 5/2007 |
| KR | 10-0723627 B1 | 6/2007 |
| KR | 10-0726132 B1 | 6/2007 |
| KR | 10-2007-0078713 A | 8/2007 |
| KR | 10-2007-0080635 A | 8/2007 |
| KR | 10-2007-0101842 A | 10/2007 |
| KR | 10-2007-0105595 A | 10/2007 |
| KR | 10-0770653 B1 | 10/2007 |
| KR | 10-2008-0001184 A | 1/2008 |
| KR | 10-0797787 B1 | 1/2008 |
| KR | 10-0800125 B1 | 1/2008 |
| KR | 10-0815265 B1 | 3/2008 |
| KR | 10-0823508 B1 | 4/2008 |
| KR | 10-0827760 B1 | 5/2008 |
| KR | 10-0839380 B1 | 6/2008 |
| KR | 10-2008-0060400 A | 7/2008 |
| KR | 10-2008-0061132 A | 7/2008 |
| KR | 10-2008-0062212 A | 7/2008 |
| KR | 10-2009-0038733 A | 4/2009 |
| KR | 10-2009-0097453 A | 9/2009 |
| KR | 10-2010-0138139 | 12/2010 |
| KR | 10-2011-0022512 A | 3/2011 |
| KR | 10-2011-0032589 A | 3/2011 |
| KR | 10-2011-0138787 | 12/2011 |
| KR | 10-2012-0042155 | 5/2012 |
| KR | 10-2012-0131545 A | 12/2012 |

OTHER PUBLICATIONS

Patent Abstracts of Japan and English Machine Translation of JP 2007-242436 A, 26 pages.

Korean Reg. Det. Certificate dated Nov. 30, 2011 for Application No. KR 10-2009-0056530, 5 pages.

(56) References Cited

OTHER PUBLICATIONS

Patent Abstracts of Japan and English Machine Translation of JP 2001-052862 A, 20 pages.

Patent Abstracts of Japan and English Machine Translation of JP 2003-3250 A, 25 pages.

* cited by examiner

ORGANIC LIGHT-EMITTING DISPLAY APPARATUS AND METHOD OF MANUFACTURING THE SAME

CROSS-REFERENCE TO RELATED PATENT APPLICATION

This application claims priority to and the benefit of Korean Patent Application No. 10-2012-0117504, filed on Oct. 22, 2012, in the Korean Intellectual Property Office, the disclosure of which is incorporated herein in its entirety by reference.

BACKGROUND

1. Field

Aspects of the present invention relate to an organic light-emitting display apparatus and a method of manufacturing the same.

2. Description of the Related Art

Organic light-emitting display devices have wider viewing angles, better contrast characteristics, and faster response speeds than other display devices, and thus have drawn attention as a next-generation display device.

An organic light-emitting display device includes intermediate layers, including an emission layer located between a first electrode and a second electrode that are arranged opposite to each other. The electrodes and the intermediate layers may be formed using various methods, one of which is an independent deposition method. When an organic light-emitting display device is manufactured by using the deposition method, a fine metal mask (FMM) having the same pattern as that of an organic layer to be formed is positioned to closely contact a substrate on which the organic layer and the like are formed, and an organic layer material is deposited on the FMM to form the organic layer having the desired pattern.

However, the deposition method using such an FMM presents difficulties in manufacturing larger organic light-emitting display devices using a large mother glass. For example, when such a large mask is used, the mask may bend due to its own weight, thereby distorting a pattern. Such disadvantages might make the FMM method undesirable in view of the recent trend towards high-definition patterns.

Moreover, processes of aligning a substrate and an FMM to closely contact each other, performing deposition thereon, and separating the FMM from the substrate are time-consuming, resulting in a long manufacturing time and low production efficiency.

Information disclosed in this Background section was known to the inventors of the present invention before achieving the present invention or is technical information acquired in the process of achieving the present invention. Therefore, it may contain information that does not form the prior art or information that was already known in this country to a person of ordinary skill in the art prior to the time the present invention was made by the inventors.

SUMMARY

Embodiments of the present invention provide a method of manufacturing an organic light-emitting display apparatus that is suitable for use in a mass production of organic light-emitting display apparatuses on a large substrate and enable high-definition patterning, and an organic light-emitting display apparatus manufactured using the method.

In one embodiment according to the present invention, an organic light-emitting display apparatus includes: a substrate; a plurality of thin film transistors on the substrate, each of the thin film transistors including an active layer, a gate electrode, and source and drain electrodes; first electrodes electrically connected to the plurality of thin film transistors, respectively, and being on respective pixels corresponding to the plurality of thin film transistors; organic layers on the first electrodes, respectively, and comprising light-emitting layers; auxiliary electrodes each of which is on at least a portion between adjacent organic layers of the organic layers; and a second electrode facing the first electrodes and covering the organic layers and the auxiliary electrodes.

In another embodiment according to the present invention, organic light-emitting display apparatus includes: a substrate; a plurality of thin film transistors on the substrate, each of the thin film transistors including an active layer, a gate electrode, and source and drain electrodes; first electrodes electrically connected to the plurality of thin film transistors, respectively, and being on respective pixels corresponding to the plurality of thin film transistors; organic layers on the first electrodes, respectively, and including light-emitting layers; a second electrode facing the first electrodes and covering the organic layers; and auxiliary electrodes on the second electrode, each of the auxiliary electrodes being on at least a portion between adjacent organic layers of the organic layers.

At least one of the organic layers on the substrate may have a linear pattern.

The auxiliary electrodes each may have a linear pattern.

The organic light-emitting display apparatus may further include a pixel-defining layer between adjacent first electrodes of the first electrodes, wherein the auxiliary electrodes are on the pixel-defining layer.

A length of a slanted side between top and bottom sides of at least one of the plurality of organic layers on the substrate that is farther from a center of a deposition region may be larger than lengths of slanted sides between respective top and bottom sides of other ones of the organic layers that are closer to the center of the deposition region.

The substrate may have a size of 40 inches or more.

The organic layers may have a non-uniform thickness.

In each of the organic layers that is farther from the center of the deposition region, the slanted side that is farther from the center of the deposition region may be larger than another slanted side.

As the plurality of organic layers in the deposition region is located farther from the center of the deposition region, an overlapped region of two sides that extend in the first direction may become narrower.

The slanted sides of the organic layer at the center of the deposition region may have substantially the same length.

The plurality of organic layers in the deposition region may be substantially symmetrically arranged about the center of the deposition region.

In another embodiment according to the present invention, an organic light-emitting display apparatus includes: a plurality of thin film transistors on a substrate, each of the thin film transistors including an active layer, a gate electrode insulated from the active layer, and source and drain electrodes that contact the active layer; a plurality of first electrodes, each of the first electrodes being on a corresponding one of the thin film transistors and being electrically connected to one of the source and drain electrodes; a plurality of pixel-defining layers between the plurality of first electrodes and covering respective edge regions of the plurality of first electrodes; a plurality of organic layers on the plurality of first electrodes; a plurality of auxiliary electrodes on the pixel-defining layers; and a second electrode facing the plurality of first electrodes and covering the organic layers and the auxiliary electrodes.

In another embodiment of the present invention, an organic light-emitting display apparatus includes: a plurality of thin film transistors on a substrate, each of the thin film transistors including an active layer, a gate electrode insulated from the active layer, and source and drain electrodes that contact the active layer; a plurality of first electrodes, each of the first electrodes being on a corresponding one of the thin film transistors and being electrically connected to one of the source and drain electrodes; a plurality of pixel-defining layers between the plurality of first electrodes and covering edge regions of the plurality of first electrodes; a plurality of organic layers on the plurality of first electrodes; a second electrode facing the plurality of first electrodes and covering the organic layers; and a plurality of auxiliary electrodes on portions of the second electrodes, which correspond to the pixel-defining layers.

Each of the plurality of auxiliary electrodes may be on at least a portion between adjacent organic layers of the organic layers.

The organic layers may be between adjacent two pixel-defining layers of the plurality of pixel-defining layers.

At least one of the organic layers on the substrate may have a linear pattern.

The auxiliary electrodes each may have a linear pattern.

A length of a slanted side between top and bottom sides of at least one of the plurality of organic layers on the substrate that is farther from a center of a deposition region may be larger than lengths of slanted sides between respective top and bottom sides of other ones of the organic layers that are closer to the center of the deposition region.

The substrate may have a size of 40 inches or more.

The organic layers may include at least a light-emitting layer.

The organic layers may have a non-uniform thickness.

In each of the organic layers that is farther from the center of the deposition region, the slanted side farther from the center of the deposition region may be larger than another slanted side.

As the plurality of organic layers in the deposition region is located farther from the center of the deposition region, an overlapped region of two sides extending in the first direction may become narrower.

The slanted sides of the organic layer located at the center of the deposition region may have substantially the same length.

The plurality of organic layers in the deposition region may be substantially symmetrically arranged about the center of the deposition region.

In another embodiment according to the present invention, a method of manufacturing an organic light-emitting display apparatus is provided. The method includes: forming a plurality of thin film transistors each including an active layer, a gate electrode insulated from the active layer, and source and drain electrodes that contact the active layer, on a substrate; forming a plurality of first electrodes that are electrically connected to the plurality of thin film transistors on the plurality of thin film transistors, respectively; forming a plurality of pixel-defining layers between the plurality of first electrodes; forming organic layers on the first electrodes; forming auxiliary electrodes that are spaced apart from the organic layers on the pixel-defining layers; and forming a second electrode covering the pixel-defining layers, the auxiliary electrodes, and the organic layers.

In another embodiment according to the present invention, a method of manufacturing an organic light-emitting display apparatus is provided. The method includes: forming a plurality of thin film transistors each including an active layer, a gate electrode insulated from the active layer, and source and drain electrodes that contact the active layer, on a substrate; forming a plurality of first electrodes that are electrically connected to the plurality of thin film transistors on the plurality of thin film transistors, respectively; forming a plurality of pixel-defining layers between the plurality of first electrodes; forming organic layers on the first electrodes; forming a second electrode covering the pixel-defining layers and the organic layers; and forming a plurality of auxiliary electrodes on portions of the second electrodes, which correspond to the pixel-defining layers.

The forming of the organic layers may include forming the organic layers in a linear pattern.

The forming of the plurality of auxiliary electrodes may include forming the auxiliary electrodes in a linear pattern.

The forming of the organic layers and the forming of the plurality of auxiliary electrodes may be performed by an organic layer deposition apparatus, wherein the organic layer deposition apparatus may include: a deposition source discharging a deposition material; a deposition source nozzle unit at a side of the deposition source and including a plurality of deposition source nozzles; and a patterning slit sheet facing the deposition source nozzle unit and including a plurality of patterning slits arranged along a direction, and wherein the deposition material discharged from the deposition source passes through the patterning slit sheet to be deposited on the substrate in a pattern.

The patterning slit sheet of the organic layer deposition apparatus may be smaller than the substrate in at least one of the first direction or a second direction perpendicular to the first direction.

In another embodiment according to the present invention, a method of manufacturing an organic light-emitting display apparatus is provided. The method includes: positioning a substrate to be spaced apart from an organic layer deposition apparatus; forming an organic layer by patterning a deposition material discharged from the organic layer deposition apparatus on the substrate while one of the organic layer deposition apparatus or the substrate is moved relative to the other one; forming an auxiliary electrode by patterning a deposition material discharged from the organic layer deposition apparatus on the substrate while one of the organic layer deposition apparatus or the substrate is moved relative to the other one; and forming a second electrode covering the organic layer and the auxiliary electrode.

The forming of the organic layer may include positioning an organic layer deposition apparatus to be spaced apart from the substrate and forming the organic layer while the organic layer deposition apparatus and the substrate are moved relative to each other, and wherein the organic layer deposition apparatus may include: a deposition source discharging a deposition material; a deposition source nozzle unit that is at a side of the deposition source and including a plurality of deposition source nozzles arranged in a first direction; a patterning slit sheet facing the deposition source nozzle unit and comprising a plurality of patterning slits arranged in the first direction; and a shielding plate assembly including a plurality of shielding plates between the deposition source nozzle unit and the patterning slit sheet in the first direction and partitioning a space between the deposition source nozzle unit and the patterning slit sheet into a plurality of deposition spaces.

The plurality of shielding plates may be each arranged in a second direction that is substantially perpendicular to the first direction and may partition the space between the deposition source nozzle unit and the patterning slit sheet into the plurality of deposition spaces.

The shielding plate assembly may include a first shielding plate assembly including a plurality of first shielding plates, and a second shielding plate assembly including a plurality of second shielding plates.

The patterning slit sheet of the organic layer deposition apparatus may be smaller than the substrate.

The forming of the organic layer may include positioning an organic layer deposition apparatus to be spaced apart from the substrate and forming the organic layer while the organic layer deposition apparatus and the substrate are moved relative to each other, and the organic layer deposition apparatus may include a deposition source discharging a deposition material; a deposition source nozzle unit at a side of the deposition source and including a plurality of deposition source nozzles arranged in a first direction; and a patterning slit sheet facing the deposition source nozzle unit and including a plurality of patterning slits arranged in the first direction The plurality of deposition source nozzles may be tilted at an angle.

The patterning slit sheet of the organic layer deposition apparatus may be smaller than the substrate.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
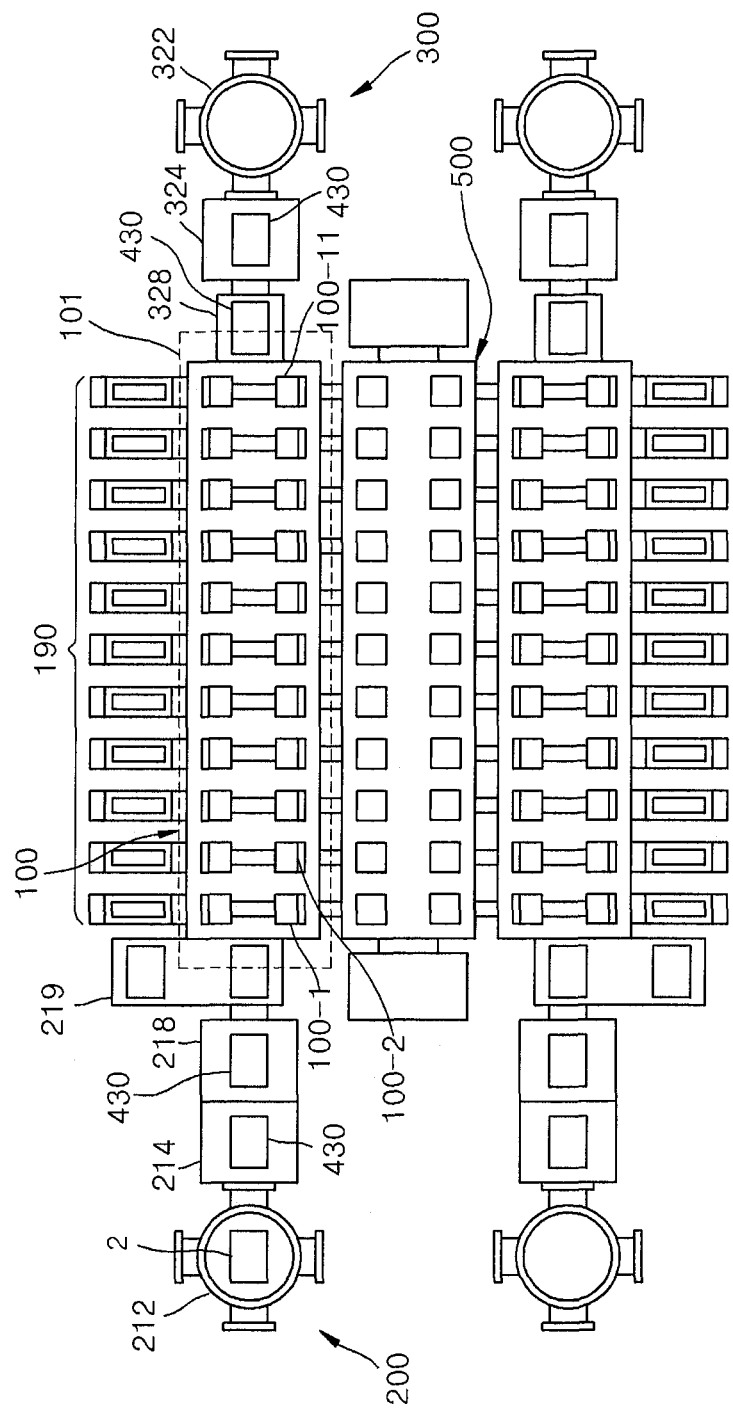
FIG. 1 is a schematic plan view illustrating a structure of an organic layer deposition apparatus according to an embodiment of the present invention.

Reference will now be made in detail to embodiments of the present invention, examples of which are illustrated in the accompanying drawings, wherein like reference numerals refer to like elements throughout. The embodiments are described below in order to explain aspects of the present invention by referring to the figures. Expressions such as "at least one of," when preceding a list of elements, modify the entire list of elements and do not modify the individual elements of the list.

Figure 2:
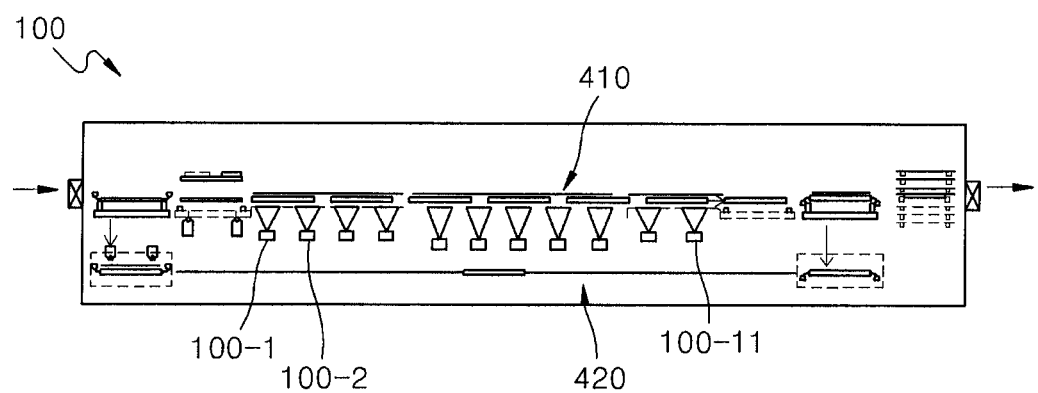
FIG. 2 is a schematic side view of a deposition unit of the organic layer deposition apparatus of FIG. 1, according to an embodiment of the present invention.

FIG. 1 is a schematic plan view illustrating a structure of an organic layer deposition apparatus 1 according to an embodiment of the present invention. FIG. 2 is a schematic side view of a deposition unit 100 of the organic layer deposition apparatus 1 of FIG. 1, according to an embodiment of the present invention.

Referring to FIGS. 1 and 2, the organic layer deposition apparatus 1 includes the deposition unit 100, a loading unit 200, an unloading unit 300, and a conveyer unit 400.

The loading unit 200 may include a first rack 212, a transport chamber 214, a first inversion chamber 218, and a buffer chamber 219.

A plurality of substrates 2 onto which a deposition material has not yet been applied are stacked up on the first rack 212. A transport robot included in the transport chamber 214 picks up one of the substrates 2 from the first rack 212, places it on a transfer unit 430 transferred by a second conveyer unit 420, and moves the transfer unit 430 on which the substrate 2 is placed into the first inversion chamber 218.

The first inversion chamber 218 is located adjacent to the transport chamber 214. The first inversion chamber 218 includes a first inversion robot that inverts the transfer unit 430 and then loads it on a first conveyer unit 410 of the deposition unit 100.

Referring to FIG. 1, the transport robot of the transport chamber 214 places one of the substrates 2 on a top surface of the transfer unit 430, and the transfer unit 430 on which the substrate 2 is placed is then transferred into the first inversion chamber 218. The first inversion robot of the first inversion chamber 218 inverts the transfer unit 430 so that the substrate 2 is turned upside down in the deposition unit 100.

The unloading unit 300 is configured to operate in an opposite manner to the loading unit 200 described above. Specifically, a second inversion robot in a second inversion chamber 328 inverts the transfer unit 430, which has passed through the deposition unit 100 while the substrate 2 is placed on the transfer unit 430, and then moves the transfer unit 430 on which the substrate 2 is placed into an ejection chamber 324. Then, an ejection robot takes the transfer unit 430 on which the substrate 2 is placed out of the ejection chamber 324, separates the substrate 2 from the transfer unit 430, and then loads the substrate 2 on a second rack 322. The transfer unit 430, separated from the substrate 2, is returned to the loading unit 200 via the second conveyer unit 420.

However, the present invention is not limited to the above example. For example, when placing the substrate 2 on the transfer unit 430, the substrate 2 may be fixed (or attached) onto a bottom surface of the transfer unit 430 and then moved into the deposition unit 100. In such an embodiment, for example, the first inversion robot of the first inversion chamber 218 and the second inversion robot of the second inversion chamber 328 may be omitted.

The deposition unit 100 may include at least one chamber for deposition. In one embodiment, as illustrated in FIGS. 1 and 2, the deposition unit 100 includes a chamber 101 in which a plurality of organic layer deposition assemblies (100-1)(100-2) . . . (100-n) may be located. Referring to FIG. 1, 11 organic layer deposition assemblies, i.e., a first organic layer deposition assembly (100-1), a second organic layer deposition assembly (100-2), through an eleventh organic layer deposition assembly (100-11), are located in the chamber 101, but the number of organic layer deposition assemblies may vary with a desired deposition material and deposition conditions. The chamber 101 is maintained in vacuum during the deposition process.

In the embodiment illustrated in FIG. 1, the transfer unit 430 with the substrate 2 fixed (or attached) thereon may be moved at least to the deposition unit 100, or may be moved sequentially to the loading unit 200, the deposition unit 100, and the unloading unit 300, by the first conveyer unit 410, and the transfer unit 430 that is separated from the substrate 2 in the unloading unit 300 may be moved back to the loading unit 200 by the second conveyer unit 420.

The first conveyer unit 410 passes through the chamber 101 when passing through the deposition unit 100, and the second conveyer unit 420 conveys (or transports) the transfer unit 430 from which the substrate 2 is separated.

In the present embodiment, the organic layer deposition apparatus is configured such that the first conveyer unit 410 and the second conveyer unit 420 are respectively positioned above and below so that after the transfer unit 430, on which deposition has been completed while passing through the first conveyer unit 410, is separated from the substrate 2 in the unloading unit 300, the transfer unit 430 is returned to the loading unit 200 via the second conveyer unit 420 formed below the first conveyer unit 410, whereby the organic layer deposition apparatus 1 may have an improved space utilization efficiency.

In an embodiment, the deposition unit 100 of FIG. 1 may further include a deposition source replacement unit 190 located at a side of each organic layer deposition assembly. Although not particularly illustrated in the drawings, the deposition source replacement unit 190 may be formed as a cassette-type that may be drawn to the outside from each organic layer deposition assembly. Thus, a deposition source 110 (refer to FIG. 3) of the organic layer deposition assembly 100-1 may be easily replaced.

Figure 3:
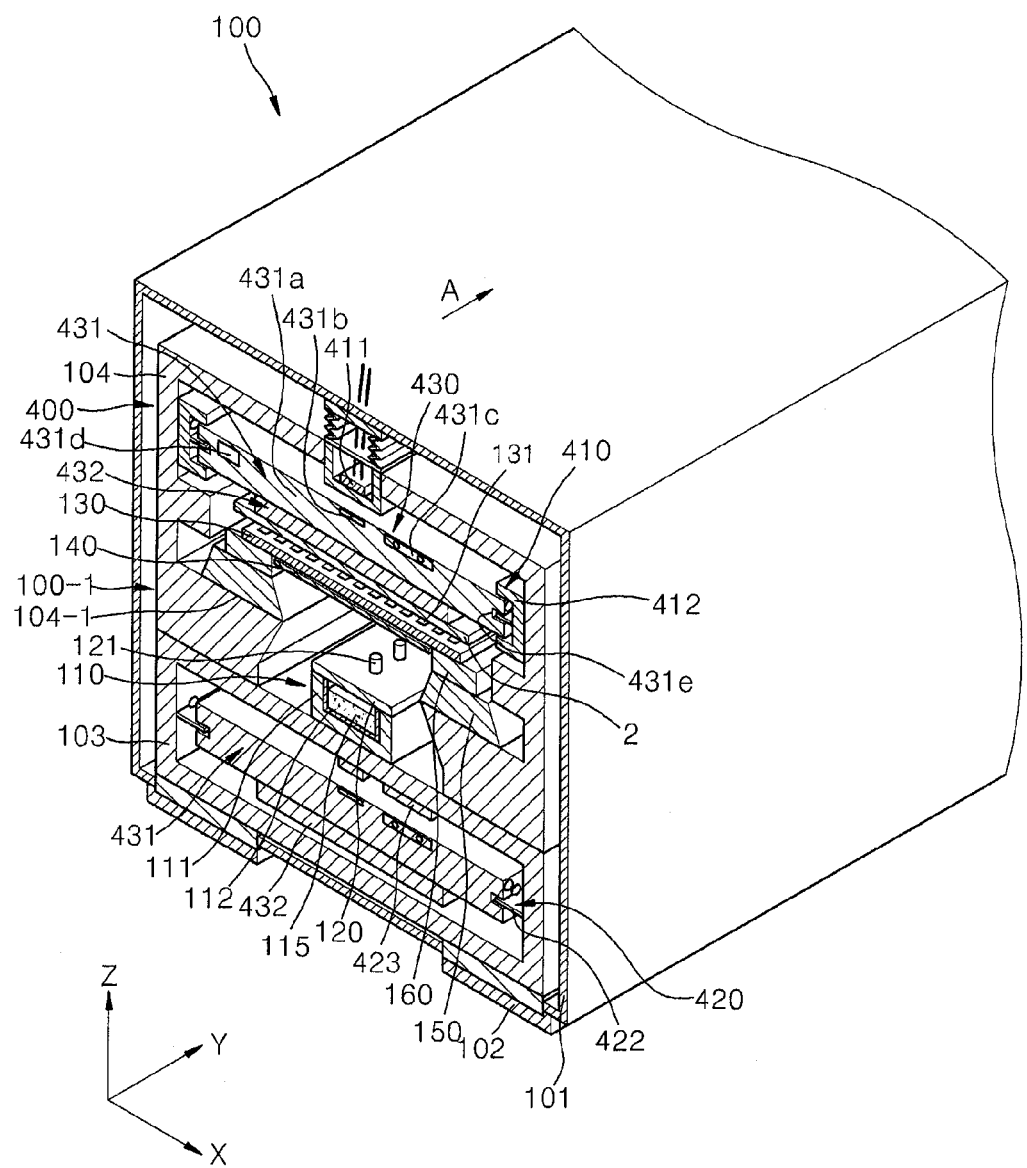
FIG. 3 is a schematic perspective view of the deposition unit of the organic layer deposition apparatus of FIG. 1, according to an embodiment of the present invention.
Figure 4:
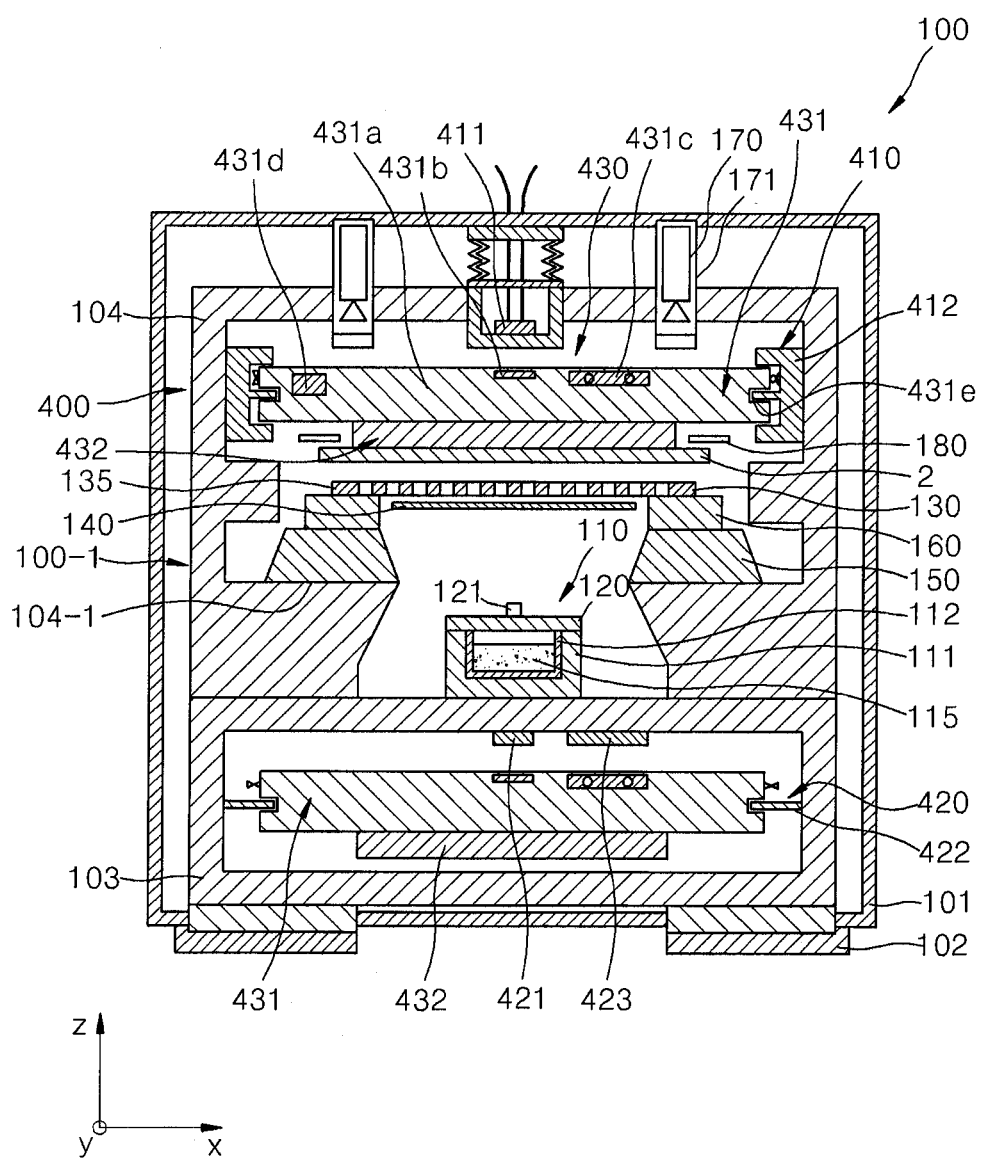
FIG. 4 is a schematic cross-sectional view of the deposition unit of FIG. 3, according to an embodiment of the present invention.
Figure 5:
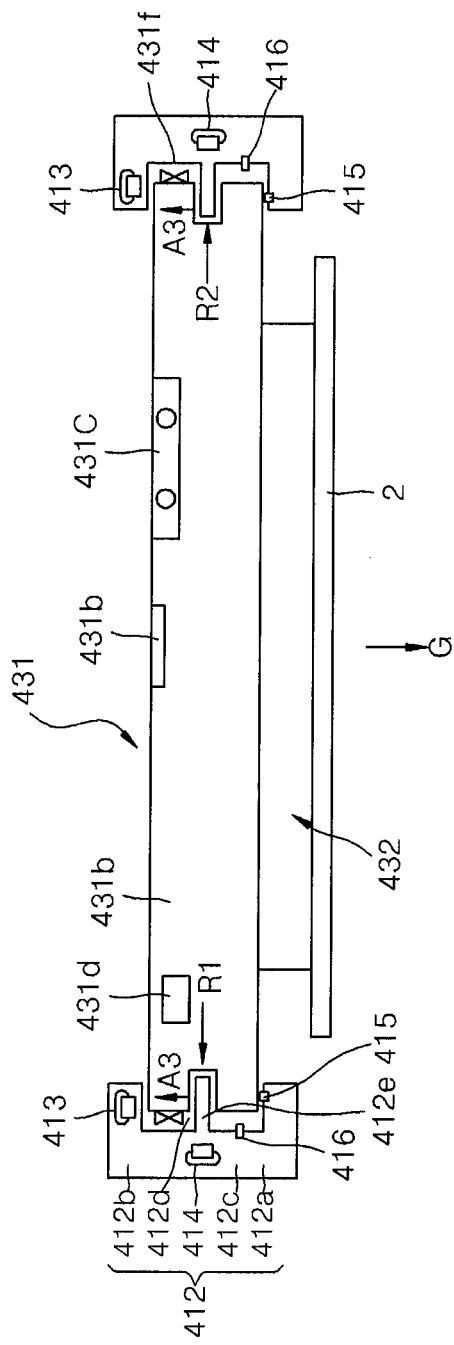
FIG. 5 is a cross-sectional view schematically illustrating a first conveyer unit and a transfer unit of the deposition unit of FIG. 3, according to an embodiment of the present invention.

FIG. 3 is a schematic perspective view of the deposition unit 100 of the organic layer deposition apparatus 1 of FIG. 1, according to an embodiment of the present invention. FIG. 4 is a schematic cross-sectional view of the deposition unit 100 of FIG. 3, according to an embodiment of the present invention. In addition, FIG. 5 is a cross-sectional view schematically illustrating a first conveyer unit 410 and a transfer unit 430 of the deposition unit 100 of FIG. 3, according to an embodiment of the present invention.

Referring to FIGS. 3 and 4, the deposition unit 100 of the organic layer deposition apparatus 1 includes at least one organic layer deposition assembly 100-1 and a conveyer unit 400.

Hereinafter, an overall structure of the deposition unit 100 will be described.

The chamber 101 may be formed as a hollow box type and accommodate the at least one organic layer deposition assembly 100-1 and the transfer unit 430. In another descriptive manner, a foot 102 is formed so as to fix the deposition unit 100 on the ground, a lower housing 103 is located on the foot 102, and an upper housing 104 is located on the lower housing 103. The chamber 101 accommodates both the lower housing 103 and the upper housing 104. In this regard, a connection part of the lower housing 103 and the chamber 101 is sealed so that the inside of the chamber 101 is completely isolated from the outside. Due to the structure in which the lower housing 103 and the upper housing 104 are located on the foot 102 fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

The upper housing 104 includes the organic layer deposition assembly 100-1 and the first conveyer unit 410 of the conveyer unit 400, and the lower housing 103 includes the second conveyer unit 420 of the conveyer unit 400. While the transfer unit 430 is cyclically moving between the first conveyer unit 410 and the second conveyer unit 420, a deposition process is continuously performed.

Hereinafter, constituents of the organic layer deposition assembly 100-1 are described in detail.

The first organic layer deposition assembly 100-1 includes the deposition source 110, a deposition source nozzle unit 120, the patterning slit sheet 130, a shielding member 140, a first stage 150, a second stage 160, a camera (or cameras) 170, and a sensor (or sensors) 180. In this regard, all the elements illustrated in FIGS. 3 and 4 may be arranged in the chamber 101 maintained in an appropriate vacuum state. This structure is used to achieve the linearity of a deposition material.

For example, in order to deposit a deposition material 115 that has been discharged from the deposition source 110 and passed through the deposition source nozzle unit 120 and the patterning slit sheet 130, onto the substrate 2 in a desired pattern, it is desirable to maintain the chamber 101 in the same vacuum state as that used in a deposition method using a fine metal mask (FMM). In addition, the temperature of the patterning slit sheet 130 should be sufficiently lower than that of the deposition source 110 (e.g., about 100° C. or less) because thermal expansion of the patterning slit sheet 130 by temperatures may be reduced or minimized when the temperature of the patterning slit sheet 130 is sufficiently low.

The substrate 2 on which the deposition material 115 is to be deposited is arranged in the chamber 101. The substrate 2 may be a substrate for a flat panel display device. For example, a large substrate, such as a mother glass, for manufacturing a plurality of flat panel displays, may be used as the substrate 2.

According to the present embodiment, the deposition process may be performed with the substrate 2 being moved relative to the organic layer deposition assembly 100-1.

In a conventional deposition method using an FMM, the size of the FMM is the same as that of a substrate. Thus, as the size of the substrate increases, the size of the FMM also increases. Due to these problems, it is difficult to fabricate the FMM and to align the FMM in a precise pattern by elongation of the FMM.

To address these problems, in the organic layer deposition assembly 100-1 according to the present embodiment, deposition may be performed while the organic layer deposition assembly 100-1 and the substrate 2 are moved relative to each other. In other words, deposition may be continuously performed while the substrate 2, which faces the organic layer deposition assembly 100-1, is moved in a Y-axis direction. That is, deposition is performed in a scanning manner while the substrate 2 is moved in a direction of arrow A illustrated in FIG. 3. Although the substrate 2 is illustrated as being moved in the Y-axis direction in the chamber 101 in FIG. 3 when deposition is performed, the present invention is not limited thereto. For example, deposition may be performed while the organic layer deposition assembly 100-1 is moved in the Y-axis direction and the substrate 2 is held in a fixed position.

Thus, in the organic layer deposition assembly 100-1, the patterning slit sheet 130 may be smaller (e.g., much smaller) than an FMM used in a conventional deposition method. In other words, in the organic layer deposition assembly 100-1, deposition is continuously performed, i.e., in a scanning manner while the substrate 2 is moved in the Y-axis direction. Thus, at least one of the lengths of the patterning slit sheet 130 in X-axis and Y-axis directions may be much less than a length of the substrate 2. Because the patterning slit sheet 130 may be formed smaller (e.g., much smaller) than the FMM used in a conventional deposition method, it is relatively easy to manufacture the patterning slit sheet 130. That is, the small patterning slit sheet 130 is more suitable in view of the manufacturing processes, including etching followed by precise elongation, welding, transferring, and washing processes, than the FMM used in a conventional deposition method. In addition, this is more suitable for manufacturing a relatively large display device.

In order to perform deposition while the organic layer deposition assembly 100-1 and the substrate 2 are moved relative to each other as described above, the organic layer deposition assembly 100-1 and the substrate 2 may be spaced apart from each other by a certain distance (e.g., a gap). This is described below in more detail.

The deposition source 110 that contains and heats the deposition material 115 is located at a side opposite to a side in which the substrate 2 is located in the chamber. As the deposition material 115 contained in the deposition source 110 is vaporized, deposition is performed on the substrate 2.

The deposition source 110 includes a crucible 111 that is filled with the deposition material 115 and a heater 112 that heats the crucible 111 so as to vaporize the deposition material 115 toward a side of the crucible 111 filled with the deposition material 115, in particular, toward the deposition source nozzle unit 120.

The deposition source nozzle unit 120, in one embodiment, is located at a side of the deposition source 110 facing the substrate 2. In this regard, the organic layer deposition assemblies according to the present embodiment each may include different deposition source nozzles in performing deposition for forming common layers and pattern layers. That is, a plurality of deposition source nozzles 121 may be formed in a deposition source nozzle unit 120 for forming a pattern layer along a Y-axis direction, that is, in a scan direction of the substrate 2. Thus, only one deposition source nozzle 121 is formed (or arranged) along an X-axis direction, thereby sufficiently reducing or preventing shadows. On the other hand, the plurality of deposition source nozzles 121 may be formed (or arranged) along the X-axis direction in a deposition source nozzle unit for forming a common layer. By doing so, a thickness uniformity of the common layer may be improved.

In one embodiment, the patterning slit sheet 130 may be located between the deposition source 110 and the substrate 2. The patterning slit sheet 130 may further include a frame 135 having a shape similar to a window frame. The patterning slit sheet 130 includes a plurality of patterning slits 131 arranged along the X-axis direction. The deposition material 115 that has been vaporized in the deposition source 110 passes through the deposition source nozzle unit 120 and the patterning slit sheet 130 and is then deposited onto the substrate 2. In this regard, the patterning slit sheet 130 may be formed using the same method as that used to form an FMM, in particular, a stripe-type mask, e.g., etching. In this regard, a total number of patterning slits 131 may be more than a total number of deposition source nozzles 121.

In one embodiment, the deposition source 110 (and the deposition source nozzle unit 120 combined thereto) and the patterning slit sheet 130 may be spaced apart from each other by a certain distance (e.g., a gap).

As described above, deposition is performed while the organic layer deposition assembly 100-1 is moved relative to the substrate 2. In order for the organic layer deposition assembly 100-1 to be moved relative to the substrate 2, the patterning slit sheet 130 is spaced apart from the substrate 2 by a certain distance (e.g., a gap).

In a conventional deposition method using an FMM, deposition is typically performed with the FMM in close contact with a substrate in order to prevent formation of shadows on the substrate. However, when the FMM is formed in close contact with the substrate, defects due to the contact between the substrate and the FMM may occur. In addition, because it is difficult to move the mask with respect to the substrate, the mask and the substrate have the same size. Accordingly, the mask becomes larger as the size of a display device increases. However, it is difficult to form a large mask.

To address these problems, in the organic layer deposition assembly 100-1 according to the present embodiment, the patterning slit sheet 130 is spaced apart by a certain distance (e.g., a gap) from the substrate 2 on which a deposition material is to be deposited.

According to the present embodiment, deposition may be performed while a mask formed smaller than a substrate is moved with respect to the substrate, and thus, it is relatively easy to manufacture the mask. In addition, defects due to contact between the substrate and the mask may be prevented. In addition, because it is unnecessary to closely contact the substrate with the mask during a deposition process, a manufacturing speed may be improved.

Hereinafter, particular disposition of each element of the upper housing 104 will be described.

The deposition source 110 and the deposition source nozzle unit 120 are located at a bottom portion of the upper housing 104. Accommodation portions 104-1 are respectively formed on both sides of the deposition source 100 and the deposition source nozzle unit 120 to have a protruding shape. The first stage 150, the second stage 160, and the patterning slit sheet 130 are sequentially formed (or located) on the accommodation portions 104-1 in this order.

In this regard, the first stage 150 is formed to move in X-axis and Y-axis directions so that the first stage 150 aligns the patterning slit sheet 130 in the X-axis and Y-axis directions. That is, the first stage 150 includes a plurality of actuators so that the first stage 150 is moved in the X-axis and Y-axis directions with respect to the upper housing 104.

The second stage 160 is formed to move in a Z-axis direction so as to align the patterning slit sheet 130 in the Z-axis direction. That is, the second stage 160 includes a plurality of actuators and is formed to move in the Z-axis direction with respect to the first stage 150.

The patterning slit sheet 130 is located on the second stage 160. The patterning slit sheet 130 is located on the first stage 150 and the second stage 160 so as to move in the X-axis, Y-axis, and Z-axis directions, and thus, an alignment, in particular, a real-time alignment, between the substrate 2 and the patterning slit sheet 130 may be performed.

In addition, the upper housing 104, the first stage 150, and the second stage 160 may guide a flow path of the deposition material 115 such that the deposition material 115 discharged through the deposition source nozzles 121 is not dispersed outside the flow path. That is, the flow path of the deposition material 115 is sealed by the upper housing 104, the first stage 150, and the second stage 160, and thus, the movement of the deposition material 115 in the X-axis and Y-axis directions may be thereby concurrently or simultaneously guided.

The shielding member 140 for preventing organic materials from being deposited on the non-film-forming region of the substrate 2 may be located between the patterning slit sheet 130 and the deposition source 110. Although not shown in detail, the shielding member 140 may include two plates that are adjacent to each other. The non-film-forming region of the substrate 2 is screened by the shielding member 140, and thus, it may be possible or relatively easy to prevent the organic material from being deposited on the non-film-forming region of the substrate 2 without using a separate structure.

Hereinafter, the conveyer unit 400 that conveys (or transports) the substrate 2, on which the deposition material 115 is to be deposited, is described in detail. Referring to FIGS. 3 and 4, the conveyer unit 400 includes the first conveyer unit 410, the second conveyer unit 420, and the transfer unit 430.

The first conveyer unit 410 conveys (or transports) in an in-line manner the transfer unit 430, including the carrier 431 and an electrostatic chuck 432 attached thereto, and the substrate 2 attached to the transfer unit 430 so that an organic layer may be formed on the substrate 2 by the organic layer deposition assembly 100-1. The first conveyer unit 410 includes a coil 411, guide members 412, upper magnetically suspended bearings (e.g., upper magnetically levitating bearings or upper magnetic levitation bearings) 413, side magnetically suspended bearings (e.g., side magnetically levitating bearings or side magnetic levitation bearings) 414, and gap sensors 415 and 416.

The second conveyer unit 420 returns to the loading unit 200 the transfer unit 430 from which the substrate 2 has been separated in the unloading unit 300 after one deposition cycle is completed while the transfer unit 430 is passing through the deposition unit 100. The second conveyer unit 420 includes a coil 421, roller guides 422, and a charging track 423.

The transfer unit 430 includes the carrier 431 that is conveyed (or transported) along the first conveyer unit 410 and the second conveyer unit 420 and the electrostatic chuck 432 that is combined on (or attached to) a surface of the carrier 431. The substrate 2 is attached to the electrostatic chuck 432 during deposition.

Hereinafter, each element of the conveyer unit 400 will be described in more detail.

The carrier 431 of the transfer unit 430 will now be described in detail.

The carrier 431 includes a main body part 431a, a magnetic rail (e.g., a linear motor system (LMS) magnet) 431b, contactless power supply (CPS) modules 431c, a power supply unit 431d, and guide grooves 431e. The carrier 431 may further include cam followers 431f (refer to FIG. 5).

The main body part 431a constitutes a base part of the carrier 431 and may be formed of a magnetic material such as iron. In this regard, due to a magnetic repulsive force and/or magnetic attractive force between the main body part 431a and the respective upper and side magnetically suspended bearings (e.g., magnetic levitation bearings) 413 and 414, which are described below, the carrier 431 may be maintained spaced apart from the guide members 412 by a certain distance (e.g., a gap).

The guide grooves 431e may be respectively formed at both sides of the main body part 431a and each may accommodate a guide protrusion 412e of the guide member 412.

The magnetic rail 431b may be formed along a center line of the main body part 431a in a direction where the main body part 431a proceeds. The magnetic rail 431b and the coil 411, which are described below, may be combined with each other to constitute a linear motor, and the carrier 431 may be conveyed (or transported) in an arrow A direction by the linear motor.

The CPS modules 431c and the power supply unit 431d may be respectively formed on both sides of the magnetic rail 431b in the main body part 431a. The power supply unit 431d is a battery for charging that provides power so that the electrostatic chuck 432 chucks (e.g., fixes or holds) the substrate 2 and maintains operation. The CPS modules 431c are a wireless charging module that charges the power supply unit 431d. For example, the charging track 423 formed in the second conveyer unit 420, which are described below, is connected to an inverter (not shown), and thus, when the carrier 431 is transferred into the second conveyer unit 420, a magnetic field is formed between the charging track 423 and the CPS modules 431c so as to supply power to the CPS module 431c. The power supplied to the CPS modules 431c is used to charge the power supply unit 431d.

The electrostatic chuck 432 may include an electrode embedded in a main body formed of ceramic, wherein the electrode is supplied with power. The substrate 2 is attached onto a surface of the main body of the electrostatic chuck 432 as a suitable voltage (e.g., a relatively high voltage or a high voltage) is applied to the electrode.

Hereinafter, an operation of the transfer unit 430 is described in detail.

The magnetic rail (e.g., LMS magnet) 431b of the main body part 431a and the coil 411 may be combined with each other to constitute a driver. In this case, the driver may be a linear motor. The linear motor has a small frictional coefficient, little position error, and a high degree (e.g., a very high degree) of position determination, as compared to a conventional slide guide system. As described above, the linear motor may include the coil 411 and the magnetic rail 431b. The magnetic rail 431b is linearly arranged in the carrier 431, and a plurality of the coils 411 may be located at an inner side of the chamber 101 by a certain distance so as to face the magnetic rail 431b. Because the magnetic rail 431b is located at the carrier 431 instead of the coil 411, the carrier 431 may be operable without power being supplied thereto. In this regard, the coil 411 may be formed in an atmosphere (ATM) box in an atmosphere state. The magnetic rail 431b is attached to the carrier 431 such that the carrier 431 may be moved in the chamber 101 in vacuum.

Hereinafter, the first conveyer unit 410 and the transfer unit 430 are described in detail.

Referring to FIGS. 4 and 5, the first conveyer unit 410 conveys (or transports) the electrostatic chuck 432 that fixes the substrate 2 and conveys the carrier 431 that conveys (or transports) the electrostatic chuck 432. In this regard, the first conveyer unit 410 includes the coil 411, the guide members 412, the upper magnetically suspended bearings (e.g., upper magnetic levitation bearings) 413, the side magnetically suspended bearings (e.g., side magnetic levitation bearings) 414, and the gap sensors 415 and 416.

The coil 411 and the guide members 412 are formed (or located) inside the upper housing 104. The coil 411 is formed (or located) in an upper portion of the upper housing 104, and the guide members 421 are respectively formed on both inner sides of the upper housing 104. The coil 411 is described below with reference to FIGS. 3 and 4.

The guide members 412 guide the carrier 431 to move in a direction. In this regard, the guide members 412 are formed to pass through the deposition unit 100.

For example, the guide members 412 accommodate both sides of the carrier 431 to guide the carrier 431 to move along in the direction of arrow A illustrated in FIG. 3. In this regard, the guide member 412 may include a first accommodation part 412a located below the carrier 431, a second accommodation part 412b located above the carrier 431, and a connection part 412c that connects the first accommodation part 412a and the second accommodation part 412b. (for example, see FIG. 5) An accommodation groove 412d is formed by the first accommodation part 412a, the second accommodation part 412b, and the connection part 412c. Both sides of the carrier 431 are respectively accommodated in the accommodation grooves 412d, and the carrier 431 is moved along the accommodation grooves 412d.

The side magnetically suspended bearings (e.g., side magnetic levitation bearings) 414 are each located at the connection part 412c of the guide member 412 so as to respectively correspond to both sides of the carrier 431. The side magnetically suspended bearings (e.g., side magnetic levitation bearings) 414 cause a distance between the carrier 431 and the guide member 412 so that the carrier 431 is moved along the guide members 412 in non-contact with the guide members 412. That is, a repulsive force R1 occurring between the side magnetically suspended bearing (e.g., side magnetic levitation bearing) 414 on the left side of in FIG. 5 and the carrier 431, which is (or includes) a magnetic material, and a repulsive force R2 occurring between the side magnetically suspended bearing (e.g., side magnetic levitation bearing) 414 on the right side in FIG. 5 and the carrier 431, which is (or includes) a magnetic material, maintain equilibrium, and thus, there is a constant (or substantially constant) distance between the carrier 431 and the respective guide members 412.

Each upper magnetically suspended bearing (e.g., upper magnetic levitation bearing) 413 may be located at the second accommodation part 412b so as to be above the carrier 431. The upper magnetically suspended bearings (e.g., upper magnetic levitation bearings) 413 enable the carrier 431 to be moved along the guide members 412 in non-contact with the first and second accommodation parts 412a and 412b and with a distance therebetween maintained constantly or substantially constantly. That is, an attractive force A3 occurring between the upper magnetically suspended bearings (e.g., upper magnetic levitation bearings) 413 and the carrier 431, which is (or includes) a magnetic material, and gravity G maintain equilibrium, and thus, there is a constant distance (or a substantially constant distance) between the carrier 431 and the respective guide members 412.

Each guide member 412 may further include the gap sensor 415. The gap sensor 415 may measure a distance between the carrier 431 and the guide member 412. Referring to FIG. 5, the gap sensor 415 may be located at the first accommodation part 412a so as to correspond to a bottom portion of the carrier 431. The gap sensor 415 located at the first accommodation part 412a may measure a distance between the first accommodation part 412a and the carrier 431. The gap sensor 416 may be located at a side of the side magnetically suspended bearing (e.g., side magnetic levitation bearing) 414. The gap sensor 416 may measure a distance between a side surface of the carrier 431 and the side magnetically suspended bearing (e.g., side magnetic levitation bearing) 414. The present invention is not limited to the above example and the gap sensor 416 may be located at the connection part 412c.

Magnetic forces of the upper and side magnetically suspended bearings (e.g., upper and side magnetic levitation bearings) 413 and 414 may vary according to values measured by the gap sensors 415 and 146, and thus, distances between the carrier 431 and the respective guide members 412 may be adjusted in real time. That is, a precise transfer of the carrier 431 may be feedback controlled using the upper and side magnetically suspended bearings (e.g., upper and side magnetic levitation bearings) 413 and 414 and the gap sensors 415 and 416.

Hereinafter, the second conveyer unit 420 and the transfer unit 430 are described in detail.

Referring back to FIG. 4, the second conveyer unit 420 returns the electrostatic chuck 432 from which the substrate 2 has been separated in the unloading unit 300 and the carrier 431 that carries the electrostatic chuck 432 to the loading unit 200. In this regard, the second conveyer unit 420 includes the coil 421, the roller guides 422, and the charging track 423.

For example, the coil 421, the roller guides 422, and the charging track 423 may be positioned inside the lower housing 103. The coil 421 and the charging track 423 may be located at a top inner surface of the lower housing 103, and the roller guides 422 may be located at both inner sides of the lower housing 103. Although not illustrated in FIG. 4, the coil 421 may be located in an ATM box, similar to the coil 411 of the first conveyer unit 410.

Similar to the first conveyer unit 410, the second conveyer unit 420 may also include the coil 421, and the magnetic rail (e.g., LMS magnet) 431b of the main body part 431a of the carrier 431 and the coil 421 are combined with each other to constitute an operation unit. In this regard, the operation unit may be a linear motor. The carrier 431 may be moved by the linear motor along a direction opposite to the direction of arrow A illustrated in FIG. 3.

The roller guides 422 guide the carrier 431 to move in a direction. In this regard, the roller guides 422 are formed to pass through the deposition unit 100. For example, the roller guides 422 support cam followers 431f (for example, see FIG. 5) respectively formed on both sides of the carrier 431 to guide the carrier 431 to move along a direction opposite to the direction of arrow A illustrated in FIG. 3. That is, the carrier 431 is moved with the cam followers 431f located on both sides of the carrier 431 respectively rotating along the roller guides 422. In this regard, the cam followers 431f are kinds of bearings used to accurately repeat a particular operation. In an embodiment, a plurality of the cam followers 431f are formed on a side surface of the carrier 431 and serve as a wheel for conveying (or transporting) the carrier 431 in the second conveyer unit 420. A detailed description of the cam followers 431f is not provided herein.

The second conveyer unit 420 is used in a process of returning the carrier 431 from which the substrate 2 has been separated and not in a process of depositing an organic material on the substrate 2, and thus, position accuracy (or positional accuracy) thereof is not needed as by the first conveyer unit 410. Therefore, magnetic suspension is applied to the first conveyer unit 410 that requires high position accuracy, thereby obtaining position accuracy, and a conventional roller method is applied to the second conveyer unit 420 that requires relatively low position accuracy, thereby reducing manufacturing costs and simplifying a structure of the organic layer deposition apparatus 1. Although not illustrated in FIG. 4, in other embodiments, the magnetic suspension (or magnetic levitation) may also be applied to the second conveyer unit 420 as in the first conveyer unit 410.

The organic layer deposition assembly 100-1 of the organic layer deposition apparatus 1 according to the present embodiment may further include the cameras 170 and the sensors 180 for an aligning process. The cameras 170 may align in real time a first alignment mark (not shown) formed in the frame 135 of the patterning slit sheet 130 and a second alignment mark (not shown) formed on the substrate 2. The sensors 180 may be confocal sensors. Because a distance between the substrate 2 and the patterning slit sheet 130 is measurable in real time using the cameras 170 and the sensors 180, the substrate 2 may be aligned with the patterning slit sheet 130 in real time, whereby position accuracy of a pattern may be improved (e.g., significantly improved).

Figure 6:
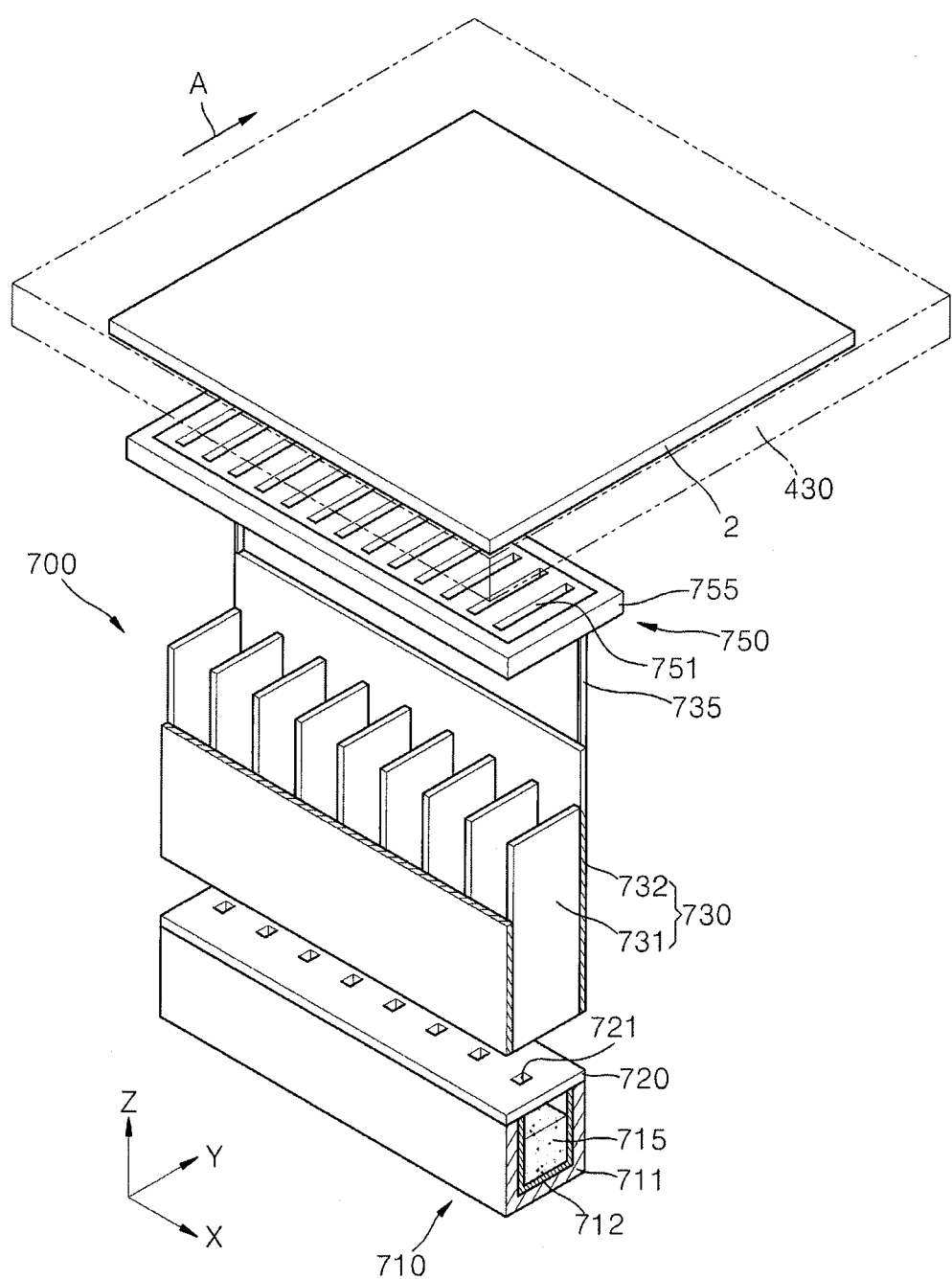
FIG. 6 is a schematic perspective view of an organic layer deposition assembly according to another embodiment of the present invention.
Figure 7:
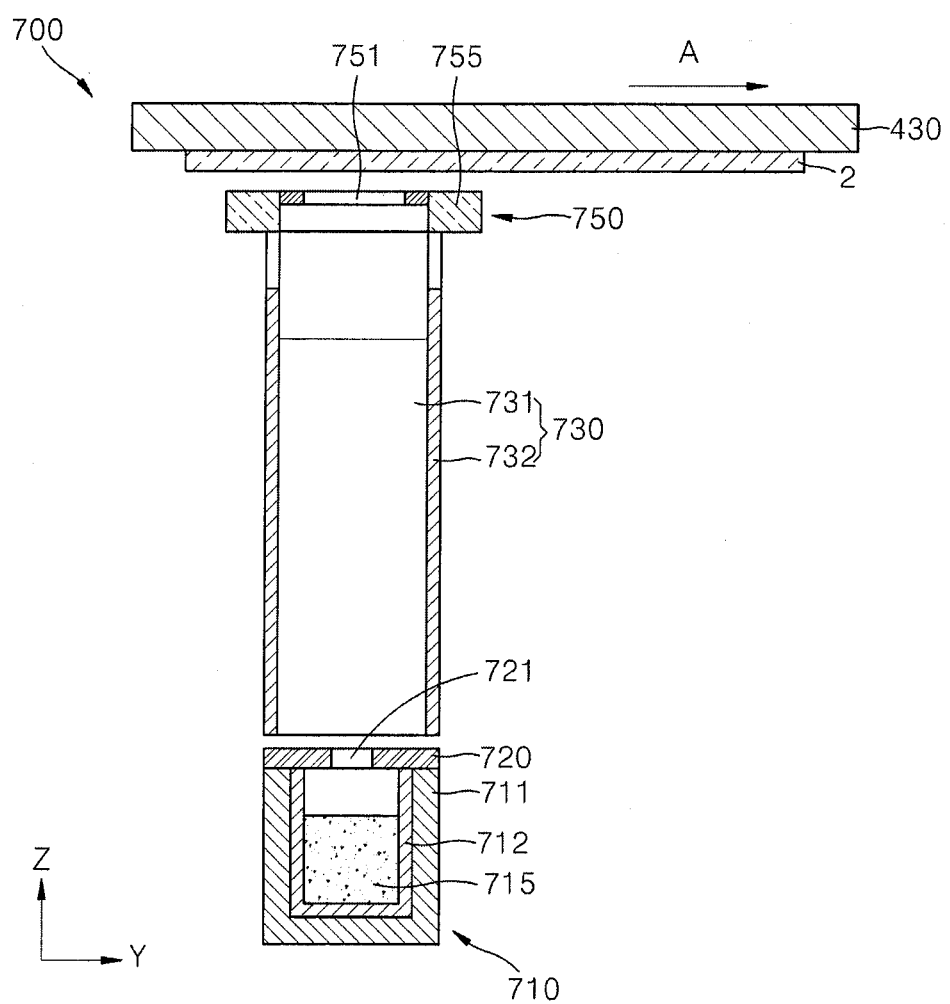
FIG. 7 is a schematic side cross-sectional view of the organic layer deposition assembly of FIG. 6.
Figure 8:
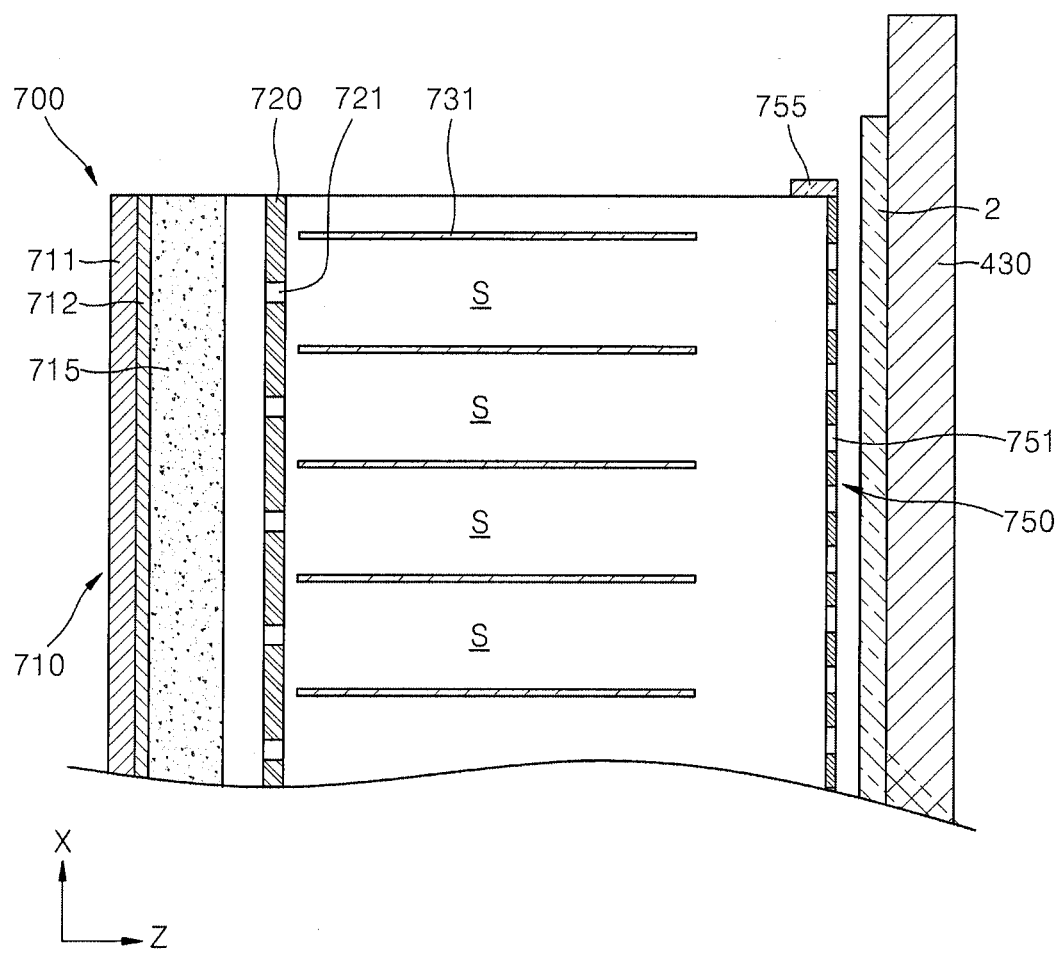
FIG. 8 is a schematic plan cross-sectional view of the organic layer deposition assembly of FIG. 6.

FIG. 6 is a schematic perspective view of an organic layer deposition assembly 700 according to another embodiment of the present invention. FIG. 7 is a schematic side cross-sectional view of the organic layer deposition assembly 700 of FIG. 6. FIG. 8 is a schematic plan cross-sectional view of the organic layer deposition assembly 700 of FIG. 6.

Referring to FIGS. 6 to 8, the organic layer deposition assembly 700 includes a deposition source 710, a deposition source nozzle unit 720, a shield plate assembly (e.g., a barrier assembly or a barrier plate assembly) 730, and a patterning slit sheet 750.

In this regard, the deposition source 710 includes a crucible 711 filled with a deposition material 715 therein, and a heater 712 that heats the crucible 711 to evaporate (or vaporize) the deposition material 715 filled in the crucible 711 toward the deposition source nozzle unit 720. The deposition source nozzle unit 720 is located at a side of the deposition source 710 and a plurality of deposition source nozzles 721 are formed in (or arranged along) an X-axis direction in the deposition source nozzle unit 720.

The shield plate assembly 730 is located at a side of the deposition source nozzle unit 720. The shield plate assembly 730 includes a plurality of shielding plates (e.g., barrier plates) 731 and a shielding plate frame (e.g., a barrier plate frame) 732 located outside (e.g., around or surrounding) the shielding plates 731. The shielding plates 731 may be arranged adjacent to each other in parallel along the X-axis direction. In this regard, the shielding plates 731 may be formed at equal intervals. In addition, each of the shielding plates 731 may extend along a YZ plane of FIG. 6 and may have a rectangular shape. As such, the shielding plates 731 divide (e.g., define or partition) a space between the deposition source nozzle unit 720 and the patterning slit sheet 750 into a plurality of deposition spaces S. That is, in the organic layer deposition assembly 700, as shown in FIG. 6, the shielding plates 731 define the deposition spaces S for the respective deposition source nozzles 721 for spraying deposition materials. As such, the shielding plates 731 divide the space between the deposition source nozzle unit 720 and the patterning slit sheet 750 into the deposition spaces S, a deposition material discharged from a deposition source nozzle 721 may not be mixed with deposition materials discharged from other deposition source nozzles 721, may be passed through patterning slits 751, and may be deposited on the substrate 2 attached to the carrier 430. That is, the shielding plates 731 guide deposition materials discharged from the deposition source nozzles 721 to move in a straight direction parallel to a Z-axis direction without being dispersed (or substantially without being dispersed).

As such, because the deposition materials may have straight properties due to the shielding plates 731, an area of shadow formed on the substrate 2 may be reduced (e.g., remarkably reduced), and thus, the organic layer deposition assembly 700 and the substrate 2 may be spaced apart from each other by a certain distance (e.g., a gap), which may be substantially constant during deposition.

The patterning slit sheet 750 is further located between the deposition source 710 and the substrate 2. The patterning slit sheet 750 may further include a frame 755 having a shape similar to a window frame. The patterning slits 751 are formed or located along an X-axis direction in the patterning slit sheet 750, and are parallel to each other. The deposition material 715 that has been vaporized in the deposition source 710 passes through the deposition source nozzle unit 720 and the patterning slit sheet 750 and then is moved toward the substrate 2 that is subject to deposition.

Figure 9:
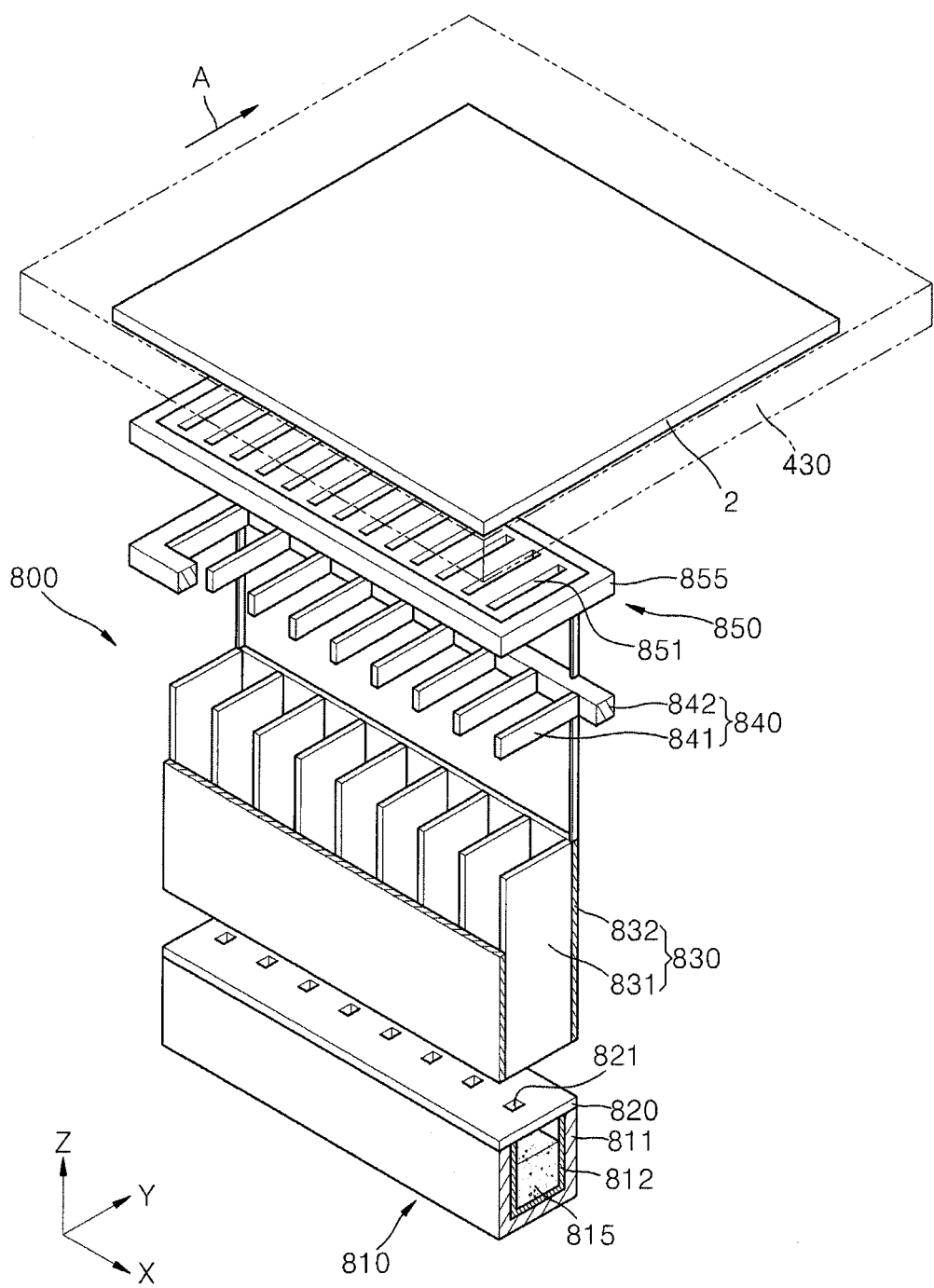
FIG. 9 is a schematic perspective view of an organic layer deposition assembly, according to another embodiment of the present invention.

FIG. 9 is a perspective view of an organic layer deposition assembly 800, according to another embodiment of the present invention.

The organic layer deposition assembly 800 shown in FIG. 9 includes a deposition source 810, a deposition source nozzle unit 820, a first shield plate assembly (e.g., a first barrier plate assembly) 830, a second shield plate assembly (e.g., a second barrier plate assembly) 840, and a patterning slit sheet 850. In this regard, the deposition source 810, the first shield plate assembly 830, and the patterning slit sheet 850 are substantially the same as corresponding components shown in FIG. 6, and thus, a detailed description thereof is omitted therein. The present embodiment is different from the above-described embodiment in that the second shield plate assembly 840 is located at a side of the first shield plate assembly 830.

For example, the second shield plate assembly 840 includes a plurality of second shielding plates (e.g., second barrier plates) 841 and a second shielding plate frame (e.g., a second barrier plate frame) 842 located outside (around or surrounding) the second shielding plates 841. The plurality of second shielding plates 841 may be arranged adjacent to each other along an X-axis direction. In addition, the plurality of second shielding plates 841 may be spaced apart from each other at equal intervals. Each of the second shielding plates 841 is formed (e.g., arranged or oriented) in parallel to a YZ plane of FIG. 9, that is, in a perpendicular direction to the X-axis direction.

A plurality of first shielding plates 831 and the second shielding plates 841 define (e.g., divide or partition) a space between the deposition source nozzle unit 820 and the patterning slit sheet 850. That is, the first shielding plates 831 and the second shielding plates 841 define (e.g., divide or partition) deposition spaces for the respective deposition source nozzles 821 for spraying deposition materials.

In this regard, the second shielding plates 841 may be arranged to have one to one correspondence with the first shielding plates 831. In other words, the second shielding plates 841 may be aligned with the first shielding plates 831 in parallel to each other. That is, the first shielding plates 831 and the second shielding plates 841, which correspond to each other, may be located on the same plane. FIG. 9 shows a case in which the width or thickness of each of the first shielding plates 831 is equal to the width of each of the second shielding plates 841 measured in the X-axis direction. However, the present invention is not limited thereto. That is, the second shielding plates 841 that are precisely aligned with (e.g., between) the patterning slits 851 may be relatively thin and the first shielding plates 831 that are not required to be precisely aligned may be relatively thick, and thus, the first shielding plates 831 and the second shielding plates 841 may be easily manufactured.

Figure 10:
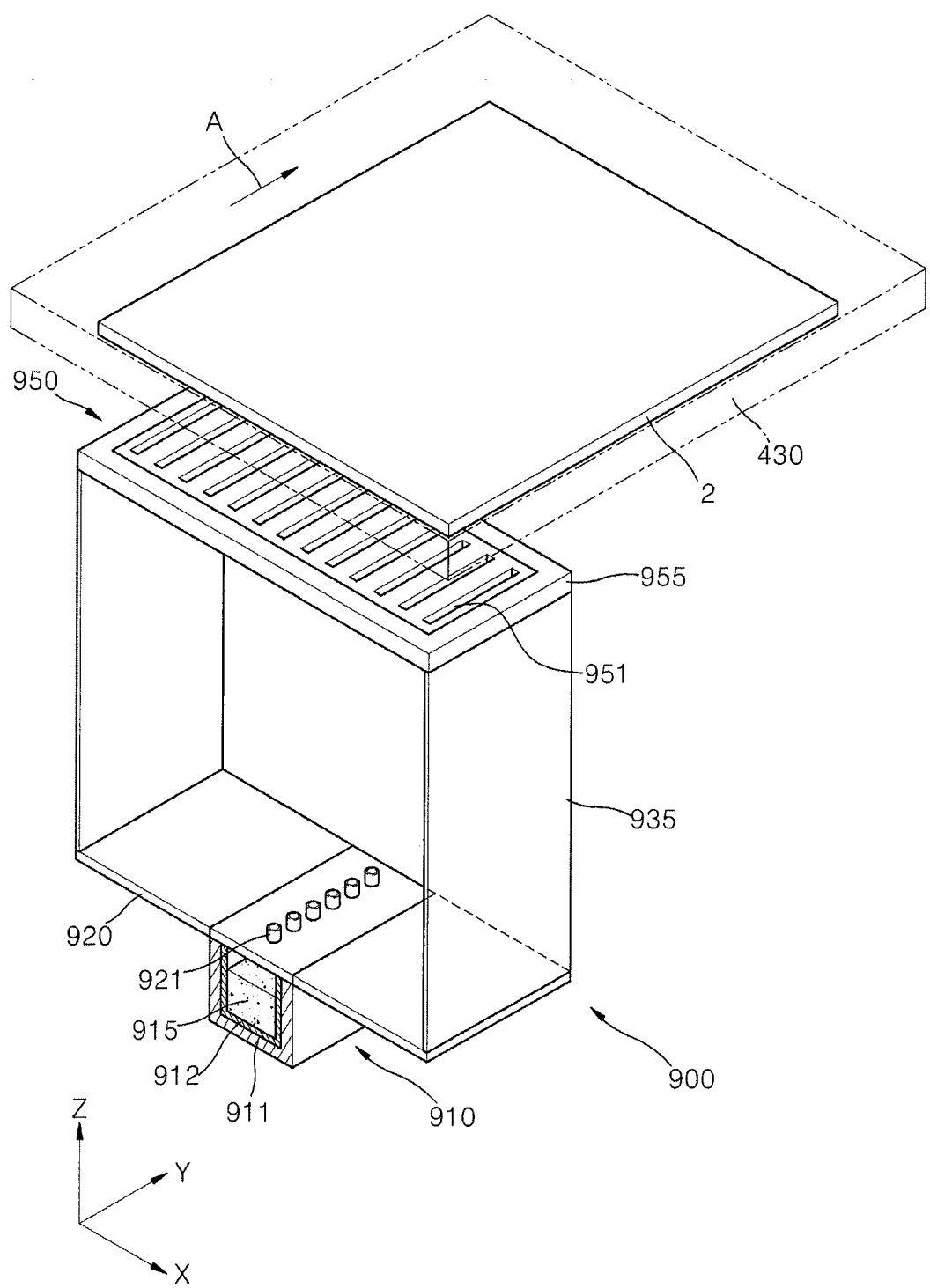
FIG. 10 is a schematic perspective view of an organic layer deposition assembly, according to another embodiment of the present invention.

FIG. 10 is a perspective view of an organic layer deposition assembly 900, according to another embodiment of the present invention.

Referring to FIG. 10, the organic layer deposition assembly 900 includes a deposition source 910, a deposition source nozzle unit 920, and a patterning slit sheet 950.

In this regard, the deposition source 910 includes a crucible 911 filled with a deposition material 915 therein, and a heater 912 that heats the crucible 911 to evaporate (or vaporize) the deposition material 915 filled in the crucible 911 toward the deposition source nozzle unit 920. The deposition source nozzle unit 920 is located at a side of the deposition source 910 and a plurality of deposition source nozzles 921 are formed (or located) along a Y-axis direction in the deposition source nozzle unit 920. The patterning slit sheet 950 and a frame 955 are further located between the deposition source 910 and the substrate 2. In addition, a plurality of patterning slits 951 are formed along an X-axis direction in the patterning slit sheet 950. Each pair of the patterning slits may have a spacer therebetween. In addition, the deposition source 910 is combined with the deposition source nozzle unit 920 and the patterning slit sheet 950 by a connection member 935.

The present embodiment is different from the above-described embodiment in terms of arrangements of the deposition source nozzles 921 included in the deposition source nozzle unit 920, which will be described in more detail.

The deposition source nozzle unit 920 is located at a side of the deposition source 910, in particular, at a side of the deposition source 910, which faces the substrate 2. A plurality of deposition source nozzles 921 are formed along a Y-axis direction, that is, a scanning direction of the substrate 2 in the deposition source nozzle unit 920. In this regard, the deposition source nozzles 921 may be formed at equal intervals. The deposition material 915 that is evaporated (or vaporized) in the deposition source 910 passes through the deposition source nozzle unit 920, and then is moved toward the substrate 2 that is subject to deposition. As a result, a plurality of deposition source nozzles 921 are formed along a scan direction of the substrate 2 in an organic layer deposition assembly 900-1. In this case, if the deposition source nozzles 921 were formed along an X-axis direction, distances between the deposition source nozzles 921 and the patterning slits 951 may be different from each other. In this case, shadow may be formed by a deposition material emitted from a deposition source nozzle 921 that is farther from the patterning slits 951. Thus, in the described embodiment, only one deposition source nozzle 921 is formed along an X-axis direction, thereby sufficiently preventing shadow. In addition, because there is the plurality of deposition source nozzles 921 arranged along the scan direction, a flux difference between separate deposition source nozzles may counterbalance to maintain deposition uniformity.

Hereinafter, a structure of an organic layer formed using the organic layer deposition apparatus described above is described in more detail.

Figure 11:
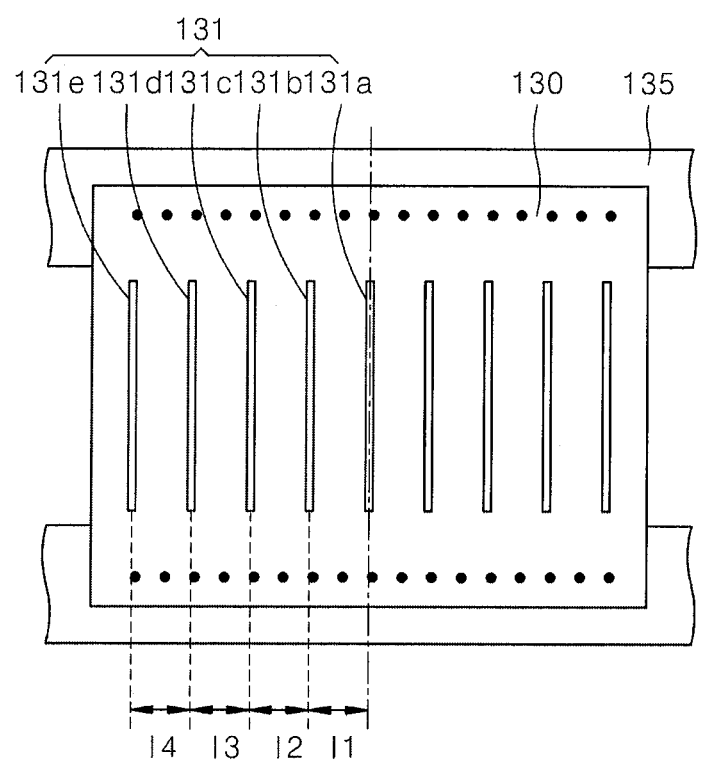
FIG. 11 is a diagram schematically illustrating a structure in which patterning slits are arranged at equal intervals in a patterning slit sheet of the organic layer deposition apparatus including the deposition unit of FIG. 3, according to an embodiment of the present invention.
Figure 12:
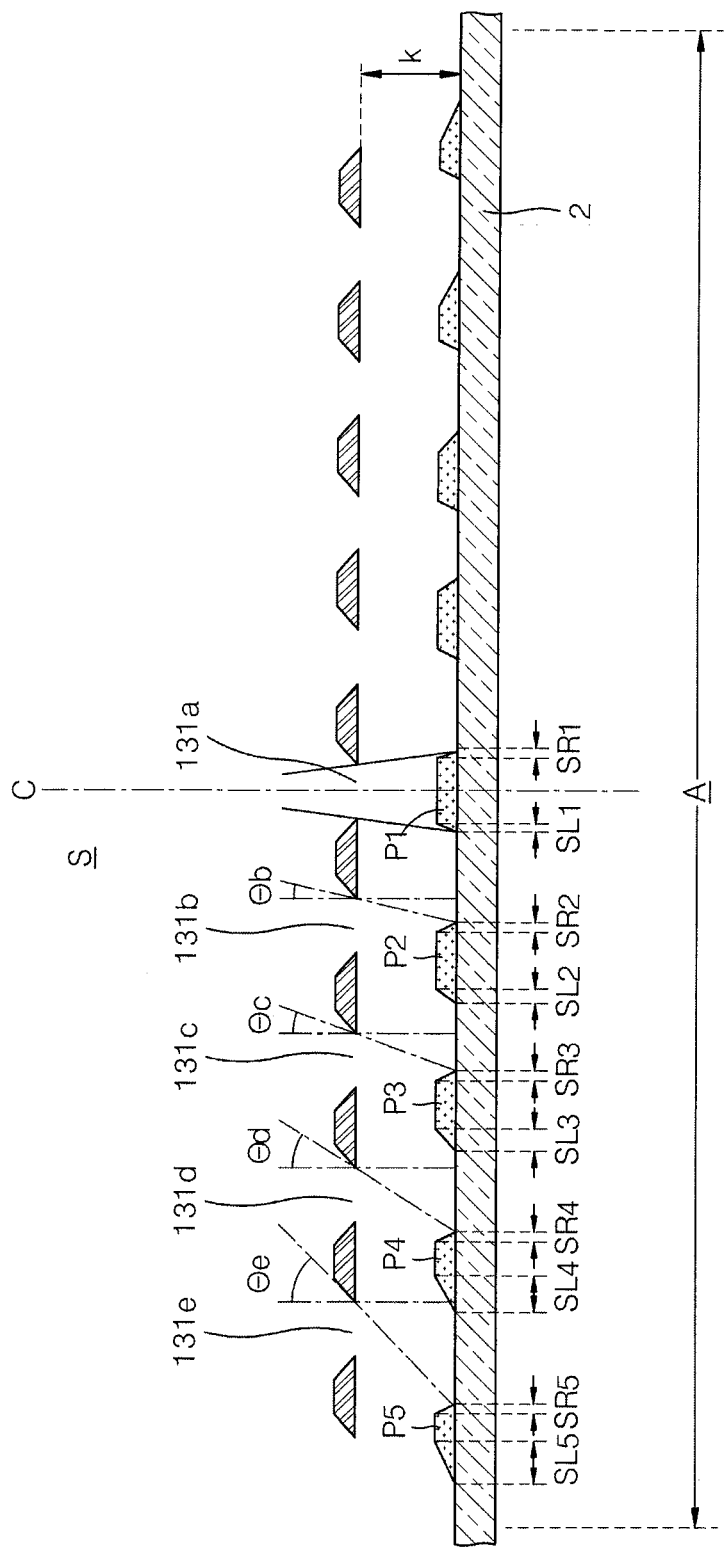
FIG. 12 is a diagram schematically illustrating organic layers formed on a substrate by using a patterning slit sheet of FIG. 11, according to an embodiment of the present invention.

FIG. 11 is a diagram schematically illustrating a structure in which the patterning slits 131 are arranged at equal intervals in the patterning slit sheet 130 of the organic layer deposition apparatus including the deposition unit 100 of FIG. 3, according to an embodiment of the present invention. FIG. 12 is a diagram illustrating organic layers formed on the substrate 2 by using the patterning slit sheet 130 of FIG. 11, according to an embodiment of the present invention.

FIGS. 11 and 12 schematically illustrate the patterning slit sheet 130 in which the patterning slits 131 are arranged at equal intervals. That is, in FIG. 11, the patterning slits 131 satisfy the following condition: $I_1=I_2=I_3=I_4$.

In this embodiment, an incident angle of a deposition material discharged along a center line C of a deposition space S is substantially perpendicular to the substrate 2. Thus, an organic layer $P_1$ formed using the deposition material that has passed through a patterning slit 131a has a minimum (or reduced) size of a shadow, and a right-side shadow $SR_1$ and a left-side shadow $SL_1$ are formed symmetrical to (or symmetrically with) each other.

However, a critical incident angle θ of the deposition material that passes through patterning slits located farther from the center line C of the deposition space S gradually increases, and thus, in one embodiment, the critical incident angle θ of the deposition material that passes through the outermost patterning slit 131e is approximately 55°. Accordingly, the deposition material is incident at an inclination with respect to the patterning slit 131e, and an organic layer $P_5$ formed using the deposition material that has passed through the patterning slit 131e has the largest shadow. For example, a left-side shadow $SL_5$ is larger than a right-side shadow $SR_5$.

That is, as the critical incident angle θ of the deposition material increases, the size of the shadow also increases. For example, the size of the shadow at a position farther from the center line C of the deposition space S increases. In addition, the critical incident angle θ of the deposition material increases as a distance between the center line C of the deposition space S and the respective patterning slits increases. Thus, organic layers formed using the deposition material that passes through the patterning slits located farther from the center line C of the deposition space S have a relatively larger shadow size. For example, of the shadows on both sides of the respective organic layers, the size of the shadow at a position farther from the center line C of the deposition space S is larger than that of the other.

That is, referring to FIG. 12, the organic layers formed on the left side of the center line C of the deposition space S have a structure in which a left hypotenuse (a slanted side on the left between top and bottom sides) is larger than a right hypotenuse (a slanted side on the right between the top and bottom sides), and the organic layers formed on the right side of the center line C of the deposition space S have a structure in which a right hypotenuse (e.g., a right slanted side) is larger than a left hypotenuse (e.g., a left slanted side).

In addition, in the organic layers formed on the left side of the center line C of the deposition space S, the length of the left hypotenuse (e.g., the left slanted side) increases towards the left. In the organic layers formed on the right side of the center line C of the deposition space S, the length of the right hypotenuse (e.g., the right slanted side) increases towards the right. Consequently, the organic layers formed in the deposition space S may be formed symmetrical to each other about the center line C of the deposition space S.

This structure will now be described in further detail.

The deposition material that passes through a patterning slit 131b passes through the patterning slit 131b at a critical incident angle of $θ_b$, and an organic layer $P_2$ formed using the deposition material that has passed through the patterning slit 131b has a left-side shadow having a size of $SL_2$. Similarly, the deposition material that passes through a patterning slit 131c passes through the patterning slit 131c at a critical incident angle of $θ_c$, and an organic layer $P_3$ formed using the deposition material that has passed through the patterning slit 131c has a left-side shadow having a size of $SL_3$. Similarly, the deposition material that passes through a patterning slit 131d passes through the patterning slit 131d at a critical incident angle of $θ_d$, and an organic layer $P_4$ formed using the deposition material that has passed through the patterning slit 131d has a left-side shadow having a size of $SL_4$. Similarly, the deposition material that passes through the patterning slit 131e passes through the patterning slit 131e at a critical incident angle of $\theta_e$, and an organic layer $P_5$ formed using the deposition material that has passed through the patterning slit 131e has a left-side shadow having a size of $SL_5$.

In this regard, the critical incident angles satisfy the following condition: $\theta_b < \theta_c < \theta_d < \theta_e$, and thus, the sizes of the shadows of the organic layers also satisfy the following condition: $SL_1 < SL_2 < SL_3 < SL_4 < SL_5$.

Figure 13:
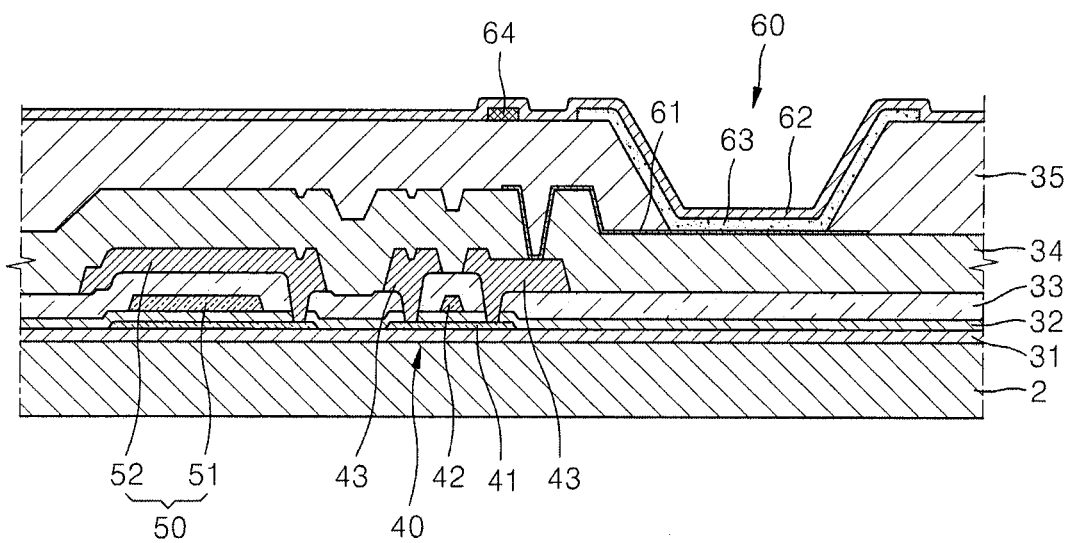
FIG. 13 is a cross-sectional view of an active matrix-type organic light-emitting display device manufactured using an organic layer deposition apparatus, according to an embodiment of the present invention.

FIG. 13 is a cross-sectional view of an active matrix-type organic light-emitting display device manufactured using the organic layer deposition apparatus 1, according to an embodiment of the present invention.

Referring to FIG. 13, the active matrix organic light-emitting display device 10 according to the current embodiment is formed on the substrate 2. The substrate 2 may be formed of a transparent material, for example, glass, plastic, or metal. An insulating layer 31, such as a buffer layer, is formed on an entire surface of the substrate 2. The insulating layer 31 may be omitted in other embodiments.

A thin film transistor (TFT) 40, a capacitor 50, and an organic light-emitting diode (OLED) 60 are formed (or located) on the insulating layer 31, as illustrated in FIG. 13.

A semiconductor active layer 41 is formed on an upper surface of the insulating layer 31 in a predetermined pattern. A gate insulating layer 32 is formed to cover the semiconductor active layer 41. The semiconductor active layer 41 may include a p-type or n-type semiconductor material.

A gate electrode 42 of the TFT 40 is formed in a region of the gate insulating layer 32 corresponding to the semiconductor active layer 41. An interlayer insulating layer 33 is formed to cover the gate electrode 42. The interlayer insulating layer 33 and the gate insulating layer 32 are etched by, for example, dry etching, to form contact holes respectively exposing parts of the semiconductor active layer 41.

Source and drain electrodes 43 are formed on the interlayer insulating layer 33 to contact the semiconductor active layer 41 through the respective contact holes. A passivation layer 34 is formed to cover the source and drain electrodes 43, and is etched to expose a part of one of the source and drain electrodes 43. An insulating layer (not shown) may be further formed on the passivation layer 34 so as to planarize the passivation layer 34.

In addition, the OLED 60 displays image information (e.g., predetermined image information) by emitting red, green, or blue light according to current. The OLED 60 includes a first electrode 61 located on the passivation layer 34. The first electrode 61 is electrically connected to the exposed one of the source and drain electrodes 43 of the TFT 40.

A pixel-defining layer 35 is formed to cover the first electrode 61. An opening is formed in the pixel-defining layer 35, and an organic layer 63 including an emission layer (EML) is formed in a region defined by the opening. A second electrode 62 is formed on the organic layer 63.

The pixel-defining layer 35, which defines individual pixels, is formed of an organic material. The pixel-defining layer 35 also planarizes the surface of a region of the substrate 2 in which the first electrode 61 is formed, and in particular, the surface of the passivation layer 34.

The first electrode 61 and the second electrode 62 are insulated from each other, and respectively apply voltages of opposite polarities to the organic layer 63 to induce light emission.

The organic layer 63, including an EML, may be formed of a low-molecular weight organic material or a high-molecular weight organic material. When a low-molecular weight organic material is used, the organic layer 63 may have a single or multi-layer structure including a hole injection layer (HIL), a hole transport layer (HTL), the EML, an electron transport layer (ETL), or an electron injection layer (EIL). Non-limiting examples of available organic materials may include copper phthalocyanine (CuPc), N,N'-di(naphthalene-1-yl)-N,N'-diphenyl-benzidine (NPB), and tris-8-hydroxyquinoline aluminum ($Alq_3$).

The organic layer 63 including an EML may be formed using any suitable one(s) of the organic layer deposition apparatuses illustrated in FIGS. 1 through 10, or any other suitable organic layer deposition apparatus using principles of the present invention. That is, an organic layer deposition apparatus including a deposition source that discharges a deposition material, a deposition source nozzle unit that is located at a side of the deposition source and includes a plurality of deposition source nozzles formed therein, and a patterning slit sheet that faces the deposition source nozzle unit and includes a plurality of patterning slits formed therein is located spaced apart by a predetermined distance (e.g., a gap) from a substrate on which the deposition material is to be deposited. In addition, the deposition material discharged from the organic layer deposition apparatus (e.g., as shown in FIG. 1) is deposited on the substrate 2 (e.g., shown in FIG. 1) while the organic layer deposition apparatus and the substrate 2 are moved relative to each other.

After the organic layer 63 is formed, the second electrode 62 may be formed by the same deposition method as used to form the organic layer 63.

An auxiliary electrode 64 is further formed on the pixel-defining layer 35. The auxiliary electrode 64 is formed on the pixel-defining layer 35 and may reduce a voltage drop due to resistance of the second electrode 62, which will be described in more detail with reference to FIGS. 14, 15, and 16.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof, and forming a layer of ITO, IZO, ZnO, or $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 may be used as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 63, and forming an auxiliary electrode layer or a bus electrode line thereon from ITO, IZO, ZnO, $In_2O_3$, or the like. When the second electrode 62 is formed as a reflective electrode, the reflective layer may be formed by depositing Li, Ca, LiF/Ca, LiF/Al, Al, Ag, Mg, or a compound thereof on the entire surface of the organic layer 63. The second electrode 62 may be formed using the same deposition method as used to form the organic layer 63 described above.

The organic layer deposition apparatuses according to the embodiments of the present invention described above may be applied to form an organic layer or an inorganic layer of an organic TFT, and/or to form layers from various materials.

Hereinafter, a method of manufacturing an organic light-emitting display apparatus by using an organic layer deposition apparatus shown in FIG. 1 will be described in detail.

Figure 14:
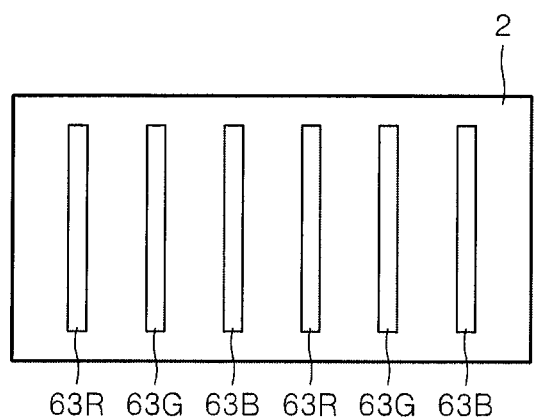
FIGS. 14 to 16 are plan views for illustrating a method of manufacturing an organic light-emitting display apparatus, according to an embodiment of the present invention.
Figure 15:
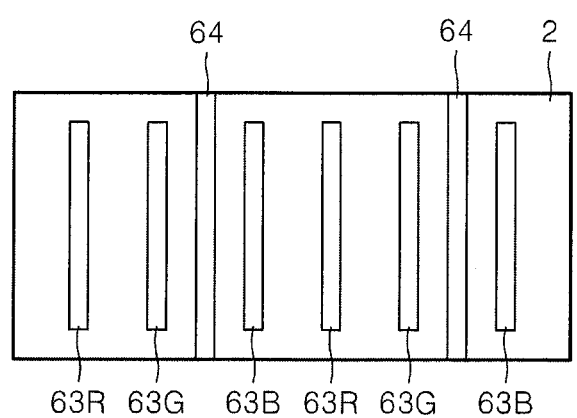
Figure 16:
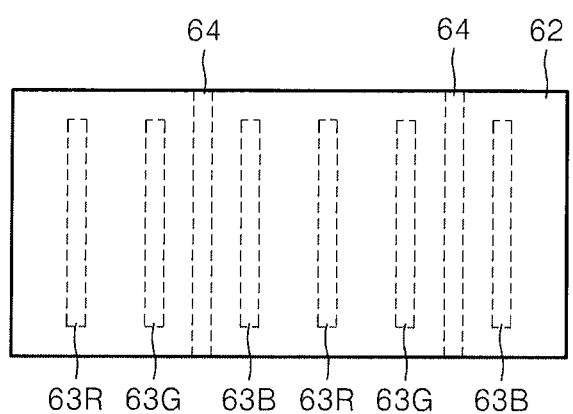

FIGS. 14 to 16 are plan views for describing a method of manufacturing an organic light-emitting display apparatus, according to an embodiment of the present invention.

First, the TFT 40 (refer to FIG. 13), the capacitor 50 (refer to FIG. 13), the first electrode 61 (refer to FIG. 13), and the pixel-defining layer 35 (refer to FIG. 13) are sequentially formed on the substrate 2.

Then, as shown in FIG. 14, the organic layer 63 is formed on the first electrode 61 (refer to FIG. 13) and the pixel-defining layer 35 (refer to FIG. 13) of the substrate 2 by using the organic layer deposition apparatus shown in FIG. 1.

As described above, in organic layer deposition apparatuses according to the one or more embodiments of the present invention, a patterning slit sheet may be smaller (e.g., much smaller) than an FMM used in a conventional deposition apparatus. In order to form an organic layer on the substrate 2 by using the patterning slit sheet, deposition is performed while the organic layer deposition apparatus and the substrate 2 are moved relative to each other. Because deposition is performed in a scanning manner while the substrate is moved in one direction, layers of the organic layer 63 are continually formed to each have a linear shape on the substrate 2 on which deposition is completely performed, as shown in FIG. 14. That is, red light-emitting layers 63R, green light-emitting layers 63G, and blue light-emitting layers 63B, each of which has a linear shape, are continually formed adjacent to each other.

Then, as shown in FIG. 15, the auxiliary electrode 64 having a linear shape is formed between layers of the organic layer 63 having a linear shape, which will be described below in detail.

In a conventional organic light-emitting display apparatus, a first electrode (an anode), an organic layer, and a second electrode (a cathode) are sequentially formed on a substrate. With regard to a top emission-type organic light-emitting display apparatus, because light is generally emitted toward the cathode, light transmittance is maintained to a suitable level or more, the cathode is formed using a translucent metal layer having a small thickness. In general, with regard to metal, a layer thickness is inversely proportional to resistance. Thus, in the top emission-type organic light-emitting display apparatus, a voltage drop due to resistance of the cathode occurs. To address this problem, a method of forming a cathode auxiliary electrode has been used.

However, when the cathode auxiliary electrode is formed on a substrate, the cathode auxiliary electrode needs to contact the cathode. To this end, in general, the cathode auxiliary electrode is formed on the substrate and a connection portion for a contact with the cathode is formed. Then, in order to prevent organic material from being deposited between the cathode and the cathode auxiliary electrode during deposition, a mask is used to cover a space between the cathode and the cathode auxiliary electrode or the deposited organic materials are removed by a laser beam.

However, in a method using a mask, high-definition masks are used, thereby reducing a manufacturing yield and increasing manufacturing costs. In addition, when the deposited organic materials are removed by a laser beam, particles may be generated.

To address these problems, in the method of manufacturing the organic light-emitting display apparatus according to embodiments of the present invention, an auxiliary electrode having a linear shape is formed on a pixel definition layer between organic layers having a linear shape by using any suitable one of the organic layer deposition apparatuses shown in FIGS. 1 to 10, and then, a second electrode that is a common layer is formed on the auxiliary electrode.

For example, as shown in FIG. 15, the auxiliary electrode 64 having a linear shape is formed on the pixel-defining layer 35 (e.g., refer to FIG. 13) between adjacent layers of the organic layer 63 having a linear shape. FIG. 15 shows the auxiliary electrode 64 is formed between a green light-emitting layer 63G and a blue light-emitting layer 63B. However, the present invention is not limited thereto. The auxiliary electrode 64 may be formed on any suitable region between adjacent layers of the organic layer 63 as long as the auxiliary electrode 64 may be formed on the pixel-defining layer 35 (e.g., refer to FIG. 13).

The auxiliary electrode 64 may be formed via a process using any suitable one of the organic layer deposition apparatuses shown in FIGS. 1 to 10, in which the substrate 2 and the organic layer deposition apparatus (e.g., refer to FIG. 1) are spaced apart from each other by a certain distance, and an auxiliary electrode forming material evaporated from the deposition source 110 (e.g., refer to FIG. 3) of the organic layer deposition apparatus (e.g., refer to FIG. 1) passes through the patterning slit sheet 130 (e.g., refer to FIG. 3) to be deposited on the substrate 2 while the substrate 2 and the organic layer deposition apparatus are moved relative to each other.

Then, as shown in FIG. 15, the second electrode 62 that is a common layer is formed on the pixel-defining layer 35 (e.g., refer to FIG. 13), the organic layer 63, and the auxiliary electrode 64 so as to cover pixel-defining layer 35 (refer to FIG. 13), the organic layer 63, and the auxiliary electrode 64 as a whole.

In addition, the second electrode 62 may be formed via a process using any suitable one of the organic layer deposition apparatuses shown in FIGS. 1 to 10, in which the substrate 2 and the organic layer deposition apparatus (e.g., refer to FIG. 1) are spaced apart from each other by a certain distance, and a second electrode forming material evaporated from the deposition source 110 (e.g., refer to FIG. 3) of the organic layer deposition apparatus (e.g., refer to FIG. 1) passes through an open mask to be deposited on the substrate 2.

FIGS. 14 to 16 show a case where the auxiliary electrode 64 is formed on the pixel-defining layer 35 (e.g., refer to FIG. 13) and then the second electrode 62 is formed on the auxiliary electrode 64. However, the present invention is not limited thereto. That is, the second electrode 62 may be formed on the pixel-defining layer 35 (e.g., refer to FIG. 13) and then the auxiliary electrode 64 may be formed on the second electrode 62.

In a conventional method, when an auxiliary electrode is formed prior to forming the OLED 60, the number of high-definition masks is increased, thereby reducing a manufacturing yield and increasing manufacturing costs. However, according to one or more embodiments of the present invention, an auxiliary electrode may be formed by additionally using an organic layer deposition assembly for forming the auxiliary electrode, thereby reducing manufacturing costs. In addition, in other methods, when generated organic materials are removed by a laser beam, particles may be generated.

However, according to one or more embodiments of the present invention, this problem is overcome.

As described above, one or more embodiments of the present invention provide organic light-emitting display apparatuses that are suitable to be manufactured in a mass production on large substrates, and enable high-definition patterning, and provide methods of manufacturing the organic light-emitting display apparatuses.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. An organic light-emitting display apparatus comprising:
   a substrate;
   a plurality of thin film transistors on the substrate, each of the thin film transistors comprising an active layer, a gate electrode, and source and drain electrodes;
   first electrodes electrically connected to the plurality of thin film transistors, respectively, and being on respective pixels corresponding to the plurality of thin film transistors;
   a plurality of organic layers on the first electrodes, respectively, and comprising light-emitting layers;
   auxiliary electrodes, each of which is on at least a portion between adjacent organic layers of the organic layers; and
   a second electrode facing the first electrodes and covering the organic layers and the auxiliary electrodes,
   wherein a length of a slanted side between top and bottom sides of one of the auxiliary electrodes is different from lengths of slanted sides between respective top and bottom sides of other ones of the auxiliary electrodes.

2. The organic light-emitting display apparatus of claim 1, wherein at least one of the organic layers on the substrate has a linear pattern.

3. The organic light-emitting display apparatus of claim 1, wherein the auxiliary electrodes each have a linear pattern.

4. The organic light-emitting display apparatus of claim 1, further comprising a pixel-defining layer between adjacent first electrodes of the first electrodes,
   wherein the auxiliary electrodes are on the pixel-defining layer.

5. The organic light-emitting display apparatus of claim 1, wherein a length of a slanted side between top and bottom sides of one of the plurality of organic layers on the substrate is different from lengths of slanted sides between respective top and bottom sides of other ones of the organic layers.

6. The organic light-emitting display apparatus of claim 5, wherein the substrate has a size of 40 inches or more.

7. The organic light-emitting display apparatus of claim 5, wherein the organic layers have a non-uniform thickness.

8. The organic light-emitting display apparatus of claim 5, wherein, in each of the other ones of the organic layers, one of the slanted sides is larger than another slanted side.

9. The organic light-emitting display apparatus of claim 5, wherein an overlapped region extending in the first direction of two sides of the one of the organic layers is wider than the overlapped region of two sides of the ones of the organic layers.

10. The organic light-emitting display apparatus of claim 5, wherein the slanted sides of the one of the organic layers have substantially the same length.

11. The organic light-emitting display apparatus of claim 5, wherein the other ones of the organic layers are substantially symmetrically arranged about the one of the organic layers.

12. An organic light-emitting display apparatus comprising:
   a substrate;
   a plurality of thin film transistors on the substrate, each of the thin film transistors comprising an active layer, a gate electrode, and source and drain electrodes;
   first electrodes electrically connected to the plurality of thin film transistors, respectively, and being on respective pixels corresponding to the plurality of thin film transistors;
   a plurality of organic layers on the first electrodes, respectively, and comprising light-emitting layers;
   a second electrode facing the first electrodes and covering the organic layers; and
   auxiliary electrodes on the second electrode, each of the auxiliary electrodes being on at least a portion between adjacent organic layers of the organic layers,
   wherein a length of a slanted side between top and bottom sides of one of the auxiliary electrodes is different from lengths of slanted sides between respective top and bottom sides of other ones of the auxiliary electrodes.

13. The organic light-emitting display apparatus of claim 12, wherein at least one of the organic layers on the substrate has a linear pattern.

14. The organic light-emitting display apparatus of claim 12, wherein the auxiliary electrodes each have a linear pattern.

15. The organic light-emitting display apparatus of claim 12, further comprising a pixel-defining layer between adjacent first electrodes of the first electrodes,
   wherein the auxiliary electrodes are on the pixel-defining layer.

16. The organic light-emitting display apparatus of claim 12, wherein a length of a slanted side between top and bottom sides of at least one of the plurality of organic layers on the substrate is different from lengths of slanted sides between respective top and bottom sides of other ones of the organic layers.

17. The organic light-emitting display apparatus of claim 16, wherein the substrate has a size of 40 inches or more.

18. The organic light-emitting display apparatus of claim 16, wherein the organic layers have a non-uniform thickness.

19. The organic light-emitting display apparatus of claim 16, wherein, in each of the other ones of the organic layers, one of the slanted sides is larger than another slanted side.

20. The organic light-emitting display apparatus of claim 16, wherein an overlapped region extending in a first direction of two sides of the one of the organic layers is wider than the overlapped region of two sides of the other ones of the organic layers.

21. The organic light-emitting display apparatus of claim 16, wherein the slanted sides of the ones of the organic layers have substantially the same length.

22. The organic light-emitting display apparatus of claim 16, wherein the other ones of the organic layers are substantially symmetrically arranged about the one of the organic layers.

23. An organic light-emitting display apparatus comprising:
   a plurality of thin film transistors on a substrate, each of the thin film transistors comprising an active layer, a gate electrode insulated from the active layer, and source and drain electrodes that contact the active layer;

a plurality of first electrodes, each of the first electrodes being on a corresponding one of the thin film transistors and being electrically connected to one of the source and drain electrodes;

a plurality of pixel-defining layers between the plurality of first electrodes and covering respective edge regions of the plurality of first electrodes;

a plurality of organic layers on the plurality of first electrodes, respectively;

a plurality of auxiliary electrodes on the pixel-defining layers; and a second electrode facing the plurality of first electrodes and covering the organic layers and the auxiliary electrodes, wherein a length of a slanted side between top and bottom sides of at least one of the plurality of auxiliary electrodes is different from lengths of slanted sides between respective top and bottom sides of other ones of the plurality of auxiliary electrodes.

24. The organic light-emitting display apparatus of claim 23, wherein each of the plurality of auxiliary electrodes is on at least a portion between adjacent organic layers of the organic layers.

25. The organic light-emitting display apparatus of claim 23, wherein the organic layers are between adjacent two pixel-defining layers of the plurality of pixel-defining layers.

26. The organic light-emitting display apparatus of claim 23, wherein at least one of the organic layers on the substrate has a linear pattern.

27. The organic light-emitting display apparatus of claim 23, wherein the auxiliary electrodes each have a linear pattern.

28. The organic light-emitting display apparatus of claim 23, wherein a length of a slanted side between top and bottom sides of one of the plurality of organic layers on the substrate is different from lengths of slanted sides between respective top and bottom sides of other ones of the organic layers.

29. The organic light-emitting display apparatus of claim 28, wherein the substrate has a size of 40 inches or more.

30. The organic light-emitting display apparatus of claim 28, wherein the organic layers comprise at least a light-emitting layer.

31. The organic light-emitting display apparatus of claim 28, wherein the organic layers have a non-uniform thickness.

32. The organic light-emitting display apparatus of claim 28, wherein, in each of the other ones of the organic layers, one of the slanted sides is larger than another slanted side.

33. The organic light-emitting display apparatus of claim 28, wherein an overlapped region extending in a first direction of two sides of the one of the organic layers is wider than the overlapped region of two sides of the other ones of the organic layers.

34. The organic light-emitting display apparatus of claim 28, wherein the slanted sides of the one of the organic layers have substantially the same length.

35. The organic light-emitting display apparatus of claim 28, wherein the other ones of the organic layers are substantially symmetrically arranged about the one of the organic layers.

36. An organic light-emitting display apparatus comprising:

a plurality of thin film transistors on a substrate, each of the thin film transistors comprising an active layer, a gate electrode insulated from the active layer, and source and drain electrodes that contact the active layer;

a plurality of first electrodes, each of the first electrodes being on a corresponding one of the thin film transistors and being electrically connected to one of the source and drain electrodes;

a plurality of pixel-defining layers between the plurality of first electrodes and covering edge regions of the plurality of first electrodes;

a plurality of organic layers on the plurality of first electrodes, respectively;

a second electrode facing the plurality of first electrodes and covering the organic layers; and a plurality of auxiliary electrodes on portions of the second electrodes, which correspond to the pixel-defining layers, wherein a length of a slanted side between top and bottom sides of one of the plurality of auxiliary electrodes is different from lengths of slanted sides between respective top and bottom sides of other ones of the plurality of auxiliary electrodes.

37. The organic light-emitting display apparatus of claim 36, wherein each of the plurality of auxiliary electrodes is on at least a portion between adjacent organic layers of the organic layers.

38. The organic light-emitting display apparatus of claim 36, wherein the organic layers are between adjacent two pixel-defining layers of the plurality of pixel-defining layers.

39. The organic light-emitting display apparatus of claim 36, wherein at least one of the organic layers on the substrate has a linear pattern.

40. The organic light-emitting display apparatus of claim 36, wherein the auxiliary electrodes each have a linear pattern.

41. The organic light-emitting display apparatus of claim 36, wherein a length of a slanted side between top and bottom sides of one of the plurality of organic layers on the substrate is different from lengths of slanted sides between respective top and bottom sides of other ones of the organic layers.

42. The organic light-emitting display apparatus of claim 41, wherein the substrate has a size of 40 inches or more.

43. The organic light-emitting display apparatus of claim 41, wherein the organic layers comprise at least a light-emitting layer.

44. The organic light-emitting display apparatus of claim 41, wherein the organic layers have a non-uniform thickness.

45. The organic light-emitting display apparatus of claim 41, wherein, in each of the other ones of the organic layers, one of the slanted sides is larger than another slanted side.

46. The organic light-emitting display apparatus of claim 41, wherein an overlapped region extending in a first direction of two sides of the one of the organic layers is wider than the overlapped region of two sides of the other ones of the organic layers.

47. The organic light-emitting display apparatus of claim 41, wherein the slanted sides of the one of the organic layers have substantially the same length.

48. The organic light-emitting display apparatus of claim 41, wherein the other ones of the organic layers are substantially symmetrically arranged about the one of the organic layers.

* * * * *